United States Patent
Staszewski et al.

(10) Patent No.: US 7,463,873 B2
(45) Date of Patent: Dec. 9, 2008

(54) WIRELESS COMMUNICATIONS DEVICE HAVING TYPE-II ALL-DIGITAL PHASE-LOCKED LOOP (PLL)

(75) Inventors: Robert B. Staszewski, Garland, TX (US); Dirk Leipold, Plano, TX (US); Khurram Muhammad, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 515 days.

(21) Appl. No.: 11/122,670

(22) Filed: May 4, 2005

(65) Prior Publication Data
US 2005/0212606 A1  Sep. 29, 2005

Related U.S. Application Data

(62) Division of application No. 10/464,957, filed on Jun. 19, 2003, now Pat. No. 7,145,399.

(60) Provisional application No. 60/441,080, filed on Jan. 17, 2003.

(51) Int. Cl.
  *H03L 7/093* (2006.01)
(52) U.S. Cl. ............................. 455/260; 331/16; 331/17
(58) Field of Classification Search .................. 331/16, 331/17; 455/260
See application file for complete search history.

(56) References Cited

U.S. PATENT DOCUMENTS

| | | | |
|---|---|---|---|
| 5,373,255 A | 12/1994 | Bray et al. | |
| 6,018,556 A | 1/2000 | Shida | |
| 6,597,754 B1 * | 7/2003 | Janesch et al. | 375/376 |
| 6,809,598 B1 | 10/2004 | Staszewski et al. | |
| 6,813,111 B2 * | 11/2004 | Bhakta et al. | 360/77.02 |
| 2001/0005164 A1 | 6/2001 | Okamoto | |
| 2003/0137329 A1 * | 7/2003 | Van Der Valk et al. | 327/156 |

FOREIGN PATENT DOCUMENTS

| | | |
|---|---|---|
| EP | 0 590 323 A1 | 4/1994 |
| EP | 1 217 745 A2 | 6/2002 |

OTHER PUBLICATIONS

"All Digital Phase-Locked Loop: Concepts, Design and Applications", Y. R. Shayan and T. Le-Ngoc, IEEE Proceedings F. Communications, Radar & Signal Processing, Institution of Electrical Engineers. Stevenage, GB, vol. 136, No. 1, Part F, Feb. 1, 1989, pp. 53-56.

* cited by examiner

*Primary Examiner*—Joseph Chang
(74) *Attorney, Agent, or Firm*—Ronald O. Neerings; Wade James Brady, III; Frederick J. Telecky, Jr.

(57) ABSTRACT

System and method for providing type-II (and higher order) phase-locked loops (PLLs) with a fast signal acquisition mode. A preferred embodiment comprises a wireless communication device having a loop filter with a proportional loop gain path (proportional loop gain circuit 1115 ) and an integral loop gain block (integral loop gain block 1120 ). The proportional loop gain path is used during signal acquisition to provide large loop bandwidth, hence fast signal acquisition of a desired signal. Then, during the PLL's signal tracking phase, the intergral loop gain block is enabled and its output is combined with output from the proportional loop gain path to provide higher order filtering of the desired signal. An offset that may be present due to the use of the proportional loop gain path can be measured and subtracted to help improve signal tracking settling times.

23 Claims, 15 Drawing Sheets

WIRELESS COMMUNICATIONS DEVICE HAVING TYPE-II ALL-DIGITAL PHASE-LOCKED LOOP (PLL)

This application is a Divisional of application Ser. No. 10/464,957, filed Jun. 19, 2003, now U.S. Pat. No. 7,145,399 which claims priority to application Ser. No. 60/441,080, filed Jan. 17, 2003, now abandoned.

This application claims the benefit of U.S. Provisional Applications No. 60/389,872, filed on Jun. 19, 2002, entitled "Graduated Exponential Bandwidth Shifting of an All-Digital PLL", No. 60/441,080, filed on Jan. 17, 2003, entitled "Type-II-All-Digital PLL in Deep-Submicron CMOS", which application is hereby incorporated herein by reference.

CROSS-REFERENCE TO RELATED APPLICATIONS

This application is related to the following co-pending and commonly assigned patent applications: Ser. No. 09/728,180, filed Dec. 1, 2000, entitled "Digital PLL with Gear Shift"; Ser. No. 10/464,982, filed Jun. 19, 2003, entitled "Fine-Grained Gear-Shifting of a Digital Phase-Locked Loop (PLL)" which application is hereby incorporated herein by reference.

TECHNICAL FIELD

The present invention relates generally to phased-locked loop (PLL) circuits, and more particularly to digital type-II (and higher order) PLLs desiring a fast signal acquisition mode.

BACKGROUND

An all digital phase-locked loop (ADPLL) is a digital circuit with a digitally controlled oscillator (DCO) which can be periodically adjusted so that the DCO's output phase tracks the phase (and hence, the frequency) of a reference signal.

The order of a PLL may have an effect upon the noise filtering capabilities of the PLL. For example, a type-I PLL (with a pole located at DC and due to the frequency-to-phase conversion mechanism) may be able to provide −20 dB/decade filtering of the DCO (or voltage controlled oscillator (VCO)), the reference signal, and the time-to-digital converter (TDC) phase noise. A type-II PLL (with two poles located at DC), on the other hand, may be able to provide—40 dB/decade filtering of the same under special conditions. Additionally, with respect to the DCO, type-I PLLs tend to flatten close-in $1/\omega^2$ phase noise, while type-II PLLs have a capability to attenuate $1/\omega^2$ phase noise by 20 dB/decade. Therefore, the use of type-II (and higher order) PLLs can be preferred due to their improved noise filtering capabilities.

However, type-II PLLs tend to have long transient settling times (when compared to type-I PLLs). The long transient settling time means that a type-II PLL will typically take longer to acquire a signal than a type-I PLL and that more time is needed for initial conditions to be eliminated from the PLL. The greater acquisition and settling times can place a limit on the frequency of the signal being tracked by the PLL.

One solution combines type-I and type-II operation and uses a type-I PLL for an initial signal acquisition phase and then switches to a type-II PLL for a signal tracking phase. The use of the type-I PLL permits a speedy lock onto the desired signal while the type-II PLL affords the noise filtering advantages of the type-II PLL.

One disadvantage of the prior art is that the use of a type-II PLL may result in slow signal acquisition and settling. This may be due in part to a type-II PLL's longer transients. The small loop bandwidth can increase the amount of time that it takes for signals to be acquired and initial conditions to settle.

A second disadvantage of the prior art is that an offset is present in the phase error from the use of the type-I PLL in the initial signal acquisition mode. This offset can increase the amount of time that the type-II PLL will require prior to being able to fully track the desired signal. This may be due to the type-II PLL's increased transients. Once again, this can have an effect on how soon the PLL is able to lock onto the desired signal.

SUMMARY OF THE INVENTION

These and other problems are generally solved or circumvented, and technical advantages are generally achieved, by preferred embodiments of the present invention which provides for a digital PLL having an adjustable loop gain wherein the adjustments are fine-grained and a method for adjusting same.

In accordance with a preferred embodiment of the present invention, a method for improving signal acquisition performance in a phase-locked loop (PLL) comprising acquiring a signal using a proportional loop gain circuit, measuring an offset in the signal, activating an integral block to accumulate an adjusted signal, and combining outputs from the proportional loop gain circuit and the integral accumulator to produce an oscillator tuning signal.

In accordance with another preferred embodiment of the present invention, a loop filter circuit comprising a proportional loop gain circuit coupled to a phase error input, the proportional loop gain circuit containing circuitry to scale a phase error signal by a first constant, an integral loop gain block coupled to the phase error input, the integral loop gain block comprising a residue latch coupled to the phase error input, the residue latch containing circuitry to sample an offset present in the phase error signal and to produce an adjusted phase error signal, an integral block coupled to the residue latch, the integral block containing circuitry to accumulate the adjusted phase error signal produced by the residue latch, a loop gain adjuster coupled to the integral block, the loop gain adjuster containing circuitry to scale the accumulated adjusted phase error signal by a second constant, and the loop filter circuit further comprising a summing point coupled to the proportional loop gain circuit and the integral loop gain block, the summing point to combine signals from the proportional loop gain circuit and the integral loop gain block.

In accordance with another preferred embodiment of the present invention, a phase-locked loop (PLL) synthesizer comprising a phase detector for providing a phase error signal, an oscillator having a tuning input, and a loop filter circuit coupled to the phase detector, wherein the loop filter circuit may operate in a fast acquisition mode and subsequently switch into a type-II mode of operation, the loop filter circuit comprising a proportional loop gain circuit coupled to the phase detector, the proportional loop gain circuit containing circuitry to scale the phase error signal by a first constant, an integral loop gain block coupled to the phase detector, the integral loop gain block containing circuitry to scale the phase error signal by a second constant, and a summing point coupled to the proportional loop gain circuit and the integral loop gain block, the summing point to combine signals from the proportional loop gain circuit and the integral loop gain block.

In accordance with another preferred embodiment of the present invention, a wireless communications device comprising a radio frequency (RF) port, an RF transceiver coupled to the RF port, the RF transceiver containing circuitry to process RF signals and a digital phase-locked loop (PLL) synthesizer coupled to the RF port, the PLL synthesizer comprising a phase detector for providing a phase error signal, an oscillator having a tuning input, a loop filter circuit coupled to the phase detector, the loop filter circuit containing circuitry to provide filtering of the phase error signal, wherein the loop filter circuit may operate in a fast acquisition mode and subsequently switch into a type-II mode of operation, and the wireless communications device further comprising a signal processing unit coupled to the RF transceiver, the signal processing unit containing circuitry to process signal streams and user usable data.

An advantage of a preferred embodiment of the present invention is that through the use of a type-I PLL in an initial signal acquisition mode and then a type-II PLL in signal tracking mode, fast signal acquisition can be combined with higher order signal and noise filtering.

Another advantage of a preferred embodiment of the present invention is that ability to eliminate the offset (residue) introduced by the type-I operation can help the type-II PLL in signal tracking mode settle more rapidly. The removal of the offset (residue) requires minimal additional hardware and the offset can optionally be retained and permitted to settle naturally, using the PLL.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawing, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely an all-digital phase-locked loop synthesizer for use in a Bluetooth compliant wireless device. The invention may also be applied, however, to other applications wherein an all-digital phased-lock loop synthesizer may be used, such as in wired and wireless devices where rapid signal acquisition may be required while at the same time, a higher order of noise filtering is desired.

Figure 1:
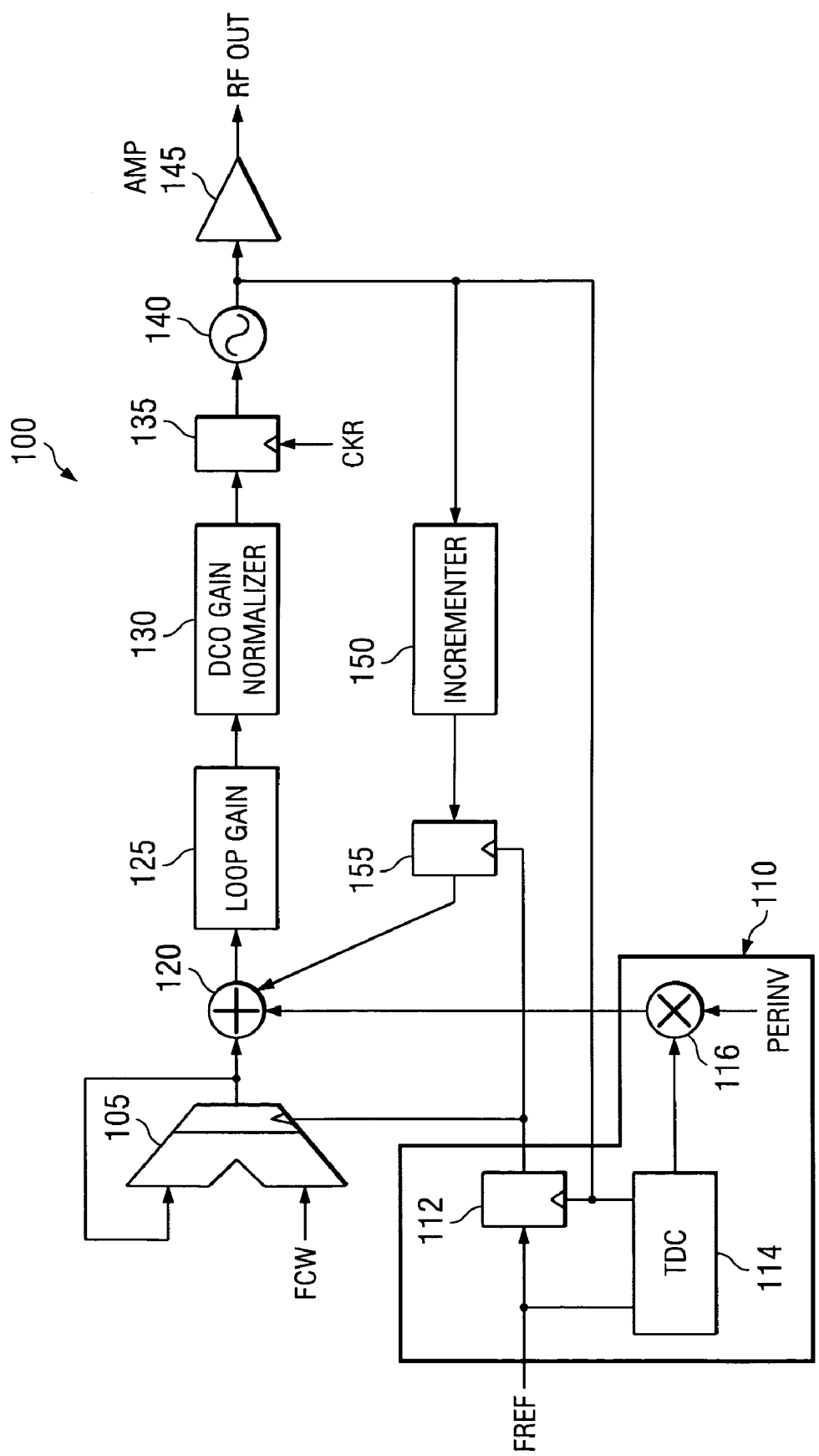
FIG. 1 is a block diagram of a phase-domain view of a prior art all-digital phased-lock loop (ADPLL) synthesizer.

With reference now to FIG. 1, there is shown a block diagram illustrating a phase-domain view of an all-digital synchronous phase-locked loop (ADPLL) synthesizer 100, according to a preferred embodiment of the present invention. As discussed previously, the purpose of the ADPLL 100 is to measure a phase difference between a reference signal, FREF (such as from a reference clock) and a variable signal (such as an output from a digitally controlled oscillator (DCO)) and to use that difference to make a frequency adjustment to the variable signal. For example, in a wireless device operating in Bluetooth communications network, the variable signal would be in the 2.4 GHz band and the reference signal is at 13 MHz.

The difference between the reference phase and the variable phase may be referred to as a phase error, $\phi_E(k)$, and can be computed in a phase detector 120 of the ADPLL 100. The phase detector 120 may have three inputs. A first input to the phase detector 120 may be provided by a reference phase accumulator 105, which can be used to compute an accumulation of a frequency control word (FCW) for the reference signal. The accumulated FCW is $R_R(k)$. The accumulation can be done on every rising edge of the retimed FREF clock. The FCW can be defined as a ratio of an expected variable frequency to the frequency of the reference signal.

A second input to the phase detector 120 can be an accumulation of edge clock transitions for the variable signal. The accumulation of the edge clock transitions for the variable signal, $R_V(k)$, may be computed in an incremeted 150 and subsequently sampled in a clocked latch 155. A third input to the phase detector 120 can be a fractional error correction value, $\epsilon(k)$, computed by a fractional error correction unit 110. The fractional error correction unit 110 may be used to compute a fractional error correction, which is a difference between the reference clock edge and the variable clock edge. The fractional error correction can be computed by converting the above difference (the difference between the reference clock edge and the variable clock edge) from a time domain into a digital domain (via a time-to-digital converter 114) and then multiplying the digital value with an inverse period (via a multiplier 116).

A proportional loop gain, $\alpha$, (or simply loop gain) is then applied (block 125) to the phase error, $\phi_E(k)$. The loop gain, $\alpha$, represents the amount of attenuation applied to the phase error prior to affecting the DCO frequency. Viewed in the frequency domain, a controls the fraction of the frequency detected in response to the frequency changed at an input to the DCO. When viewed in the time domain, $\alpha$ controls how much timing attenuation within a reference clock cycle should be seen at the input to the DCO in response to an observed change in DCO input seen in the previous clock cycle.

Figure 2:
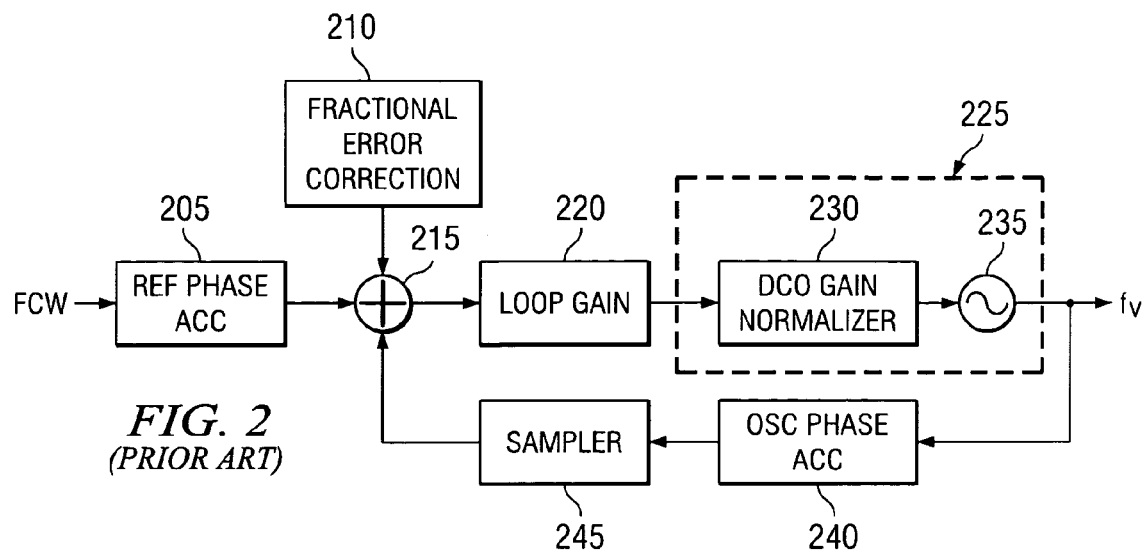
FIG. 2 is an alternate phase-domain view of the prior art ADPLL.

Finally, DCO tuning (the signal used to adjust the DCO frequency) is normalized with respect to the DCO gain (ratio of frequency deviation per one step (least significant bit) of DCO tuning word) and sampled by a clocked latch 135 prior to being applied to the DCO 140. Output of the DCO 140 is the variable phase signal and may be buffered and amplified by a power amplifier 145 to produce a radio frequency output signal. FIG. 2 provides an alternate view of the ADPLL in the phase-domain, with emphasis placed upon the functions of the different components of the ADPLL.

Figure 3A:
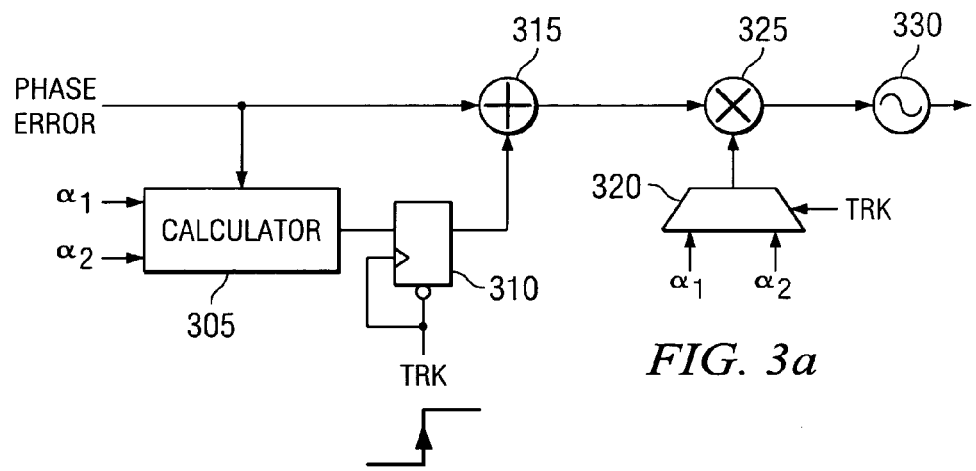
FIGS. 3*a* and 3*b* are diagrams of a portion of a type-I and a higher order ADPLL.
Figure 3B:
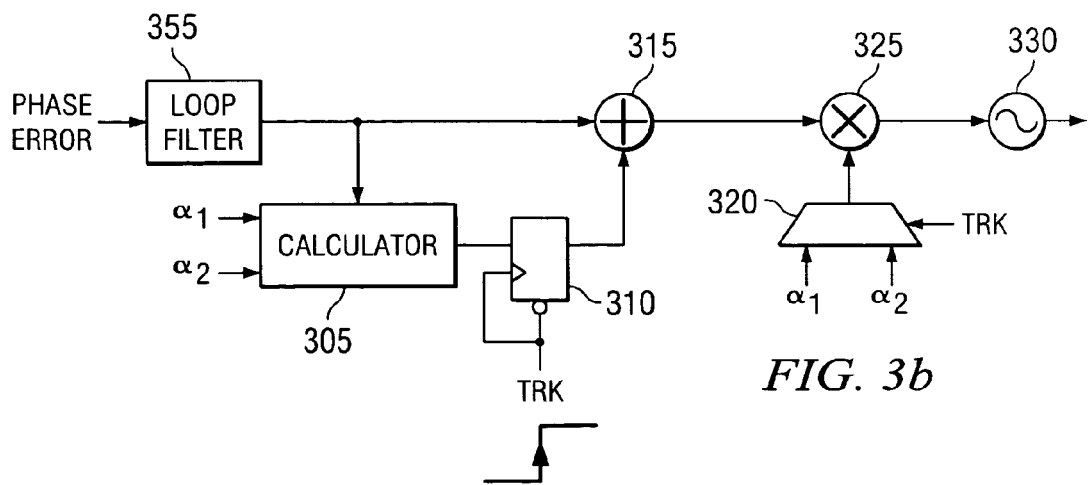

With reference now to FIGS. 3a and 3b, there are shown diagrams illustrating a portion of a ADPLL (FIG. 3a) and a higher order ADPLL (FIG. 3b) that can be used to provide a technique that can be used to make an adjustment in the loop gain, allowing a change in a mode of operation for the ADPLLs. Note that FIGS. 3a and 3b illustrate a portion of the ADPLLs after phase detection has been performed, for example, to the right of the phase detector 120 (FIG. 1). Also, other portions of the ADPLL, such as the feedback loop, are not displayed to permit focus on the support for the loop gain adjustment hardware.

The technique for adjusting loop gain is a two step technique. A first step consists of adding a DC offset to the signal used to adjust the DCO and a second step changes the value of the loop gain, $\alpha$. A calculator unit 305, coupled to the output of a phase detector, can be used to determine a magnitude of the DC offset to be added to the DCO tuning signal. The magnitude of the DC offset may be a function of the loop gains, $\alpha 1$ and $\alpha 2$. A flip flop 310 can be used to store the value of the DC offset and to provide that stored value to an adder 315, which combines a phase error adjust signal with the DC offset. In practice, the flip flop 320 may be implemented as a state machine with a synchronous reset that stores a new phase error adjustment into a cleared register upon transition from acquisition interval to tracking interval.

A multiplexer 320, controlled by a tracking signal "TRK", may be used to select one of the two loop gains, $\alpha 1$ or $\alpha 2$. The selected loop gain value can then be multiplied with the DCO adjust signal via the use of a multiplier 325. The gain adjusted DCO tuning signal can then be provided to a DCO 330. Note that the value of the tracking signal "TRK" determines when the ADPLL switches intervals of operation. FIG. 3b adds a loop filter 355, which provides the necessary filtering to make the ADPLL a higher order PLL.

A reduction in the loop gain, $\alpha$, results in a corresponding and proportional reduction in the amount of noise in the phase error. Therefore, if the loop gain is halved, then there will be a proportional decrease in the amount of noise in the phase error. However, a sudden and dramatic decreases in the loop gain will likely result in the creation of a transient in the phase error. The transient will have to be given time to settle. Unfortunately, with the decrease in the loop gain (and the corresponding decrease in the loop bandwidth), the transient may require an extended amount of time to settle. This can decrease the overall performance of the ADPLL.

Figure 3C:
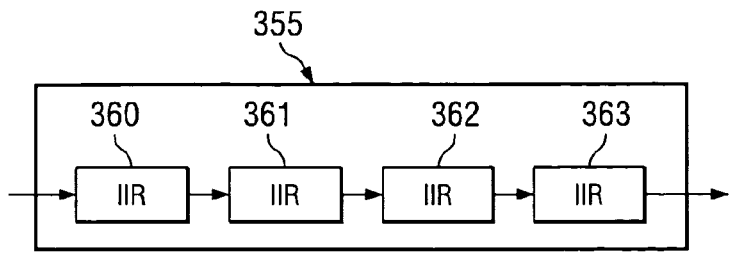
FIGS. 3*c* and 3*d* are diagrams of a loop filter for a higher order ADPLL in greater detail, according to a preferred embodiment of the present invention.

With reference now to FIG. 3c, there is shown a diagram illustrating a high level view of the loop filter 355 for a higher order ADPLL, according to a preferred embodiment of the present invention. As displayed in FIG. 3c, the loop filter 355 (FIG. 3b) can be implemented out of a cascade of several single-pole IIR filters (such as IIR filters 360, 361, 362, and 363). The four IIR filters 360-363 in the loop filter 355 can provide up to a fifth-order ADPLL. Note that more (or less) IIR filters can be used in the loop filter 355 and that the four IIR filters 360-363 are used for illustrative purposes only. Additionally, the loop filter 355 could also be placed in the higher order ADPLL after the computation of the adjusted phase error.

Figure 3D:
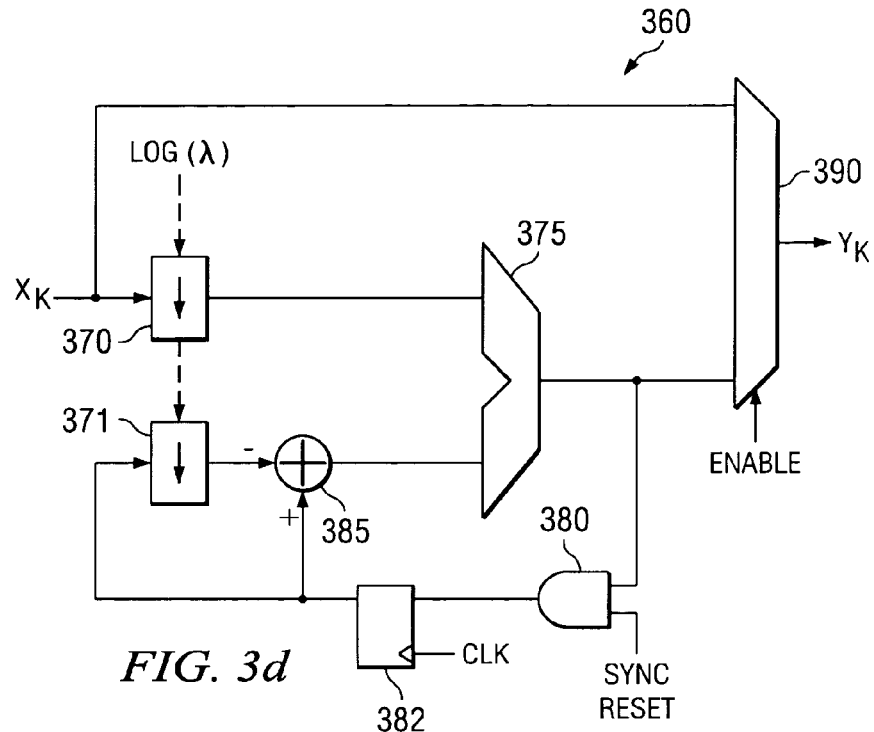

With reference now to FIG. 3d, there is shown a diagram illustrating a detailed view of the IIR filter 360 usable in the loop filter 355 of a higher order ADPLL, according to a preferred embodiment of the present invention. Note that the IIR 360 may used in any of the four IIR filters (360-363) displayed in FIG. 3c. As displayed in FIG. 3d, the IIR filter 360 has a z-domain transfer function expressible as $$H(z) = \frac{\lambda \cdot z}{z - (1 - \lambda)},$$

where $\lambda$ is a positive attenuation factor, with magnitude of less than one. Since the values in the ADPLL are expressed as binary values, it is possible to perform the attenuation, $\lambda$, via a right bit shift operation (bit shift units 370 and 371) with shifts equal to $\text{Log}(\lambda)$, where the Log( ) is a base 2 operation. An arithmetic unit (adder) 375 along with a flip flop 382 and a summing point 385 combine to implement the transfer function. An AND gate 380 with one input coupled to a synchronous reset can be used to clear the state of the IIR filter 360.

The IIR filter 360 also has a bypass feature, implemented via a multiplexer 390 (controlled by an enable signal). For example, if the enable is on, the IIR filter 360 is used to provide single pole filtering and if the enable is off, the multiplexer 390 can place at its output, the input directly coupled to the input of the IIR filter 360. Therefore, depending on the value of the enable signal, the input signal may be placed at the output of the IIR filter 360 filtered or unfiltered. Note however, that even if the IIR filter 360 is bypassed, the filtering is still taking place, therefore, should it be desired to enable the filtering of the IIR filter 360, the filtered input signal can be selected for the output of the IIR filter 360 with little or no delay, i.e., the switchable filtering offered by the IIR filter 360 is hitless.

With reference back to FIG. 3c, when each of the IIR filters 360-363 are implemented as illustrated in FIG. 3d, it is possible to change the order of the loop filter 355 by dynamically enabling some, all, or none of the IIR filters. For example, if it is desired to have a loop filter 355 of the first order, then only one of the IIR filters (for example, IIR filter 360) may be enabled and the remaining IIR filters will be disabled.

Figure 4A:
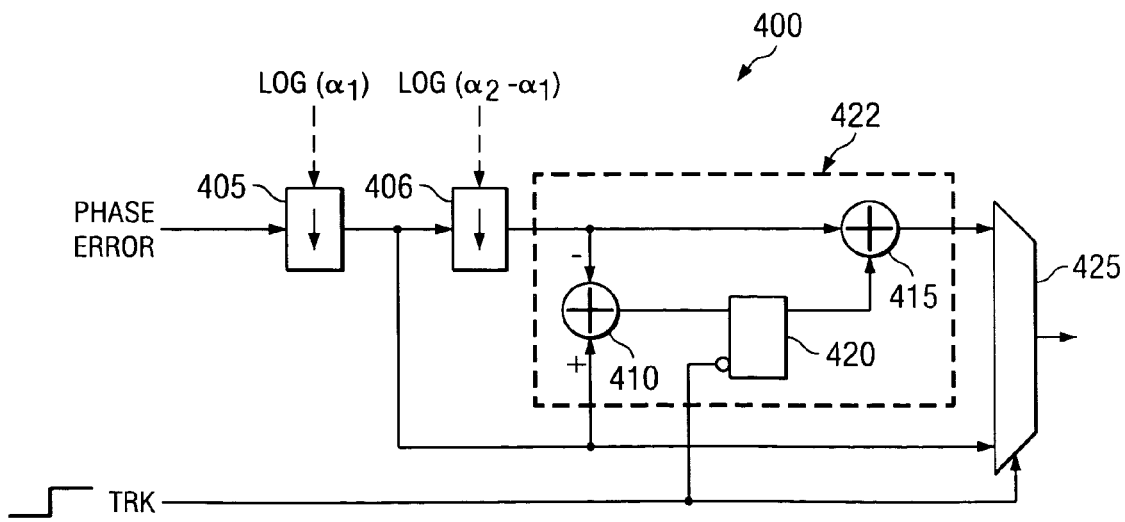
FIG. 4*a* is a diagram of a portion of an ADPLL with the capability of making an adjustment to the loop gain, according to a preferred embodiment of the present invention.

With reference now to FIG. 4a, there is shown a diagram illustrating a portion of an ADPLL 400 with the capability of making an adjustment to the loop gain, according to a preferred embodiment of the present invention. According to a preferred embodiment of the present invention, the loop gain, $\alpha$, is adjusted from an initial value of $\alpha 1$ to a final value of $\alpha 2$. To accomplish this, the ADPLL 400 can make use of two gain adjusters, a first gain adjuster 405 and a second gain adjuster 406. Since the ADPLL uses binary values, the gain adjusters can modify the loop gain by simply performing a binary shift of the phase error. Additionally, since the gain adjustments tend to reduce the loop gain, the binary gain adjustments made by the first and second gain adjusters 405 and 406 can be implemented as right shifts. The first gain adjuster 405 may shift every phase error value by $Log(\alpha 1)$, wherein the Logo is a base 2 operation. This provides the initial loop gain value of $\alpha 1$ for use while the ADPLL is operating in a signal acquisition interval. The second gain adjuster 406 performs a shift that can be equal to $Log(\alpha 2-\alpha 1)$. This provides the loop gain of $\alpha 2$ for use when the ADPLL is operating in a signal tracking interval.

Adjustments can be made to the DCO tuning words when the loop gain is changed from $\alpha 1$ to $\alpha 2$, creating a normalized tuning word. Adjustments can be made using two summing points 410 and 415 and a latch 420. This circuit can be referred to as a normalized tuning word unit 422. The first summing point 410 subtracts ($\alpha_2$*phase error) from ($\alpha_1$*phase error). The result of the subtraction can then be stored in the latch 420 when the latch 420 is enabled (such as when a signal "TRK" transitions from low to high). The result of the subtraction can then be combined with ($\alpha_2$*phase error) in the second summing point 415, creating the adjusted normalized tuning word. A multiplexer 425 can be used to select the tuning words for when the loop gain is $\alpha 1$ or when the loop gain is $\alpha 2$. Output from the multiplexer 425 can then be provided to the DCO.

Figure 4B:
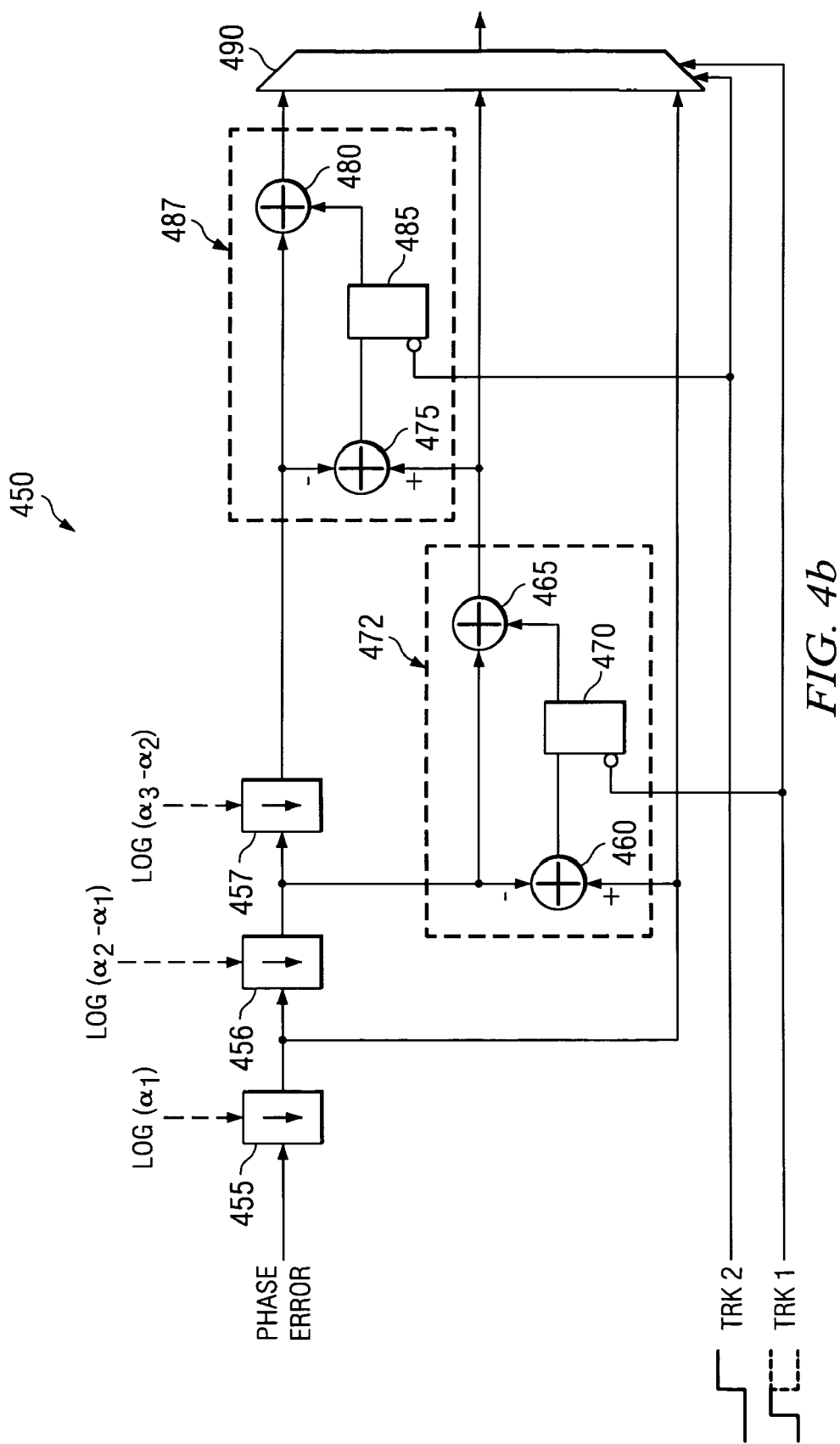
FIG. 4*b* is a diagram of a portion of an ADPLL with the capability of making two adjustments to the loop gain, according to a preferred embodiment of the present invention.

With reference now to FIG. 4b, there is shown a portion of an ADPLL 450 with the capability of making two adjustments to the loop gain, according to a preferred embodiment of the present invention. The portion of the ADPLL 450 illustrated in FIG. 4b is similar to the portion of the ADPLL 400 illustrated in FIG. 4a with the addition of an additional gain adjuster (gain adjuster 457) to provide the needed gain adjustment to change the loop gain from $\alpha 2$ to $\alpha 3$. Furthermore, to create normalized tuning words for when the loop gain is $\alpha 3$, a second normalized tuning word unit 487 can be added to operate alongside a first normalized tuning word unit 472. A multiplexer 490 may be used to select the tuning words for the various values of loop gains ($\alpha 1$, $\alpha 2$, and $\alpha 3$).

A pair of tracking signals "TRK1" and "TRK2" can be used to control the operation of a pair of latches 470 and 485 as well as the multiplexer 490. According to a preferred embodiment of the present invention, when a tracking signal changes to an active level, the latch to which it is coupled captures (samples) the value and holds it. Additionally, it is preferred that only one of the tracking signals be transitioning into the active level at one time. For example, if tracking signal "TRK1" is transitioning into the active level, then tracking signal "TRK2" should remain in the inactive level. After tracking signal "TRK2" changes into the active level, it no longer matters what tracking signal "TRK1" does, it can remain in the active level or it can return to the inactive level. In other words, once the tracking signal "TRK2" enters the active level, tracking signal "TRK1" becomes a "don't care."

Figure 5A:
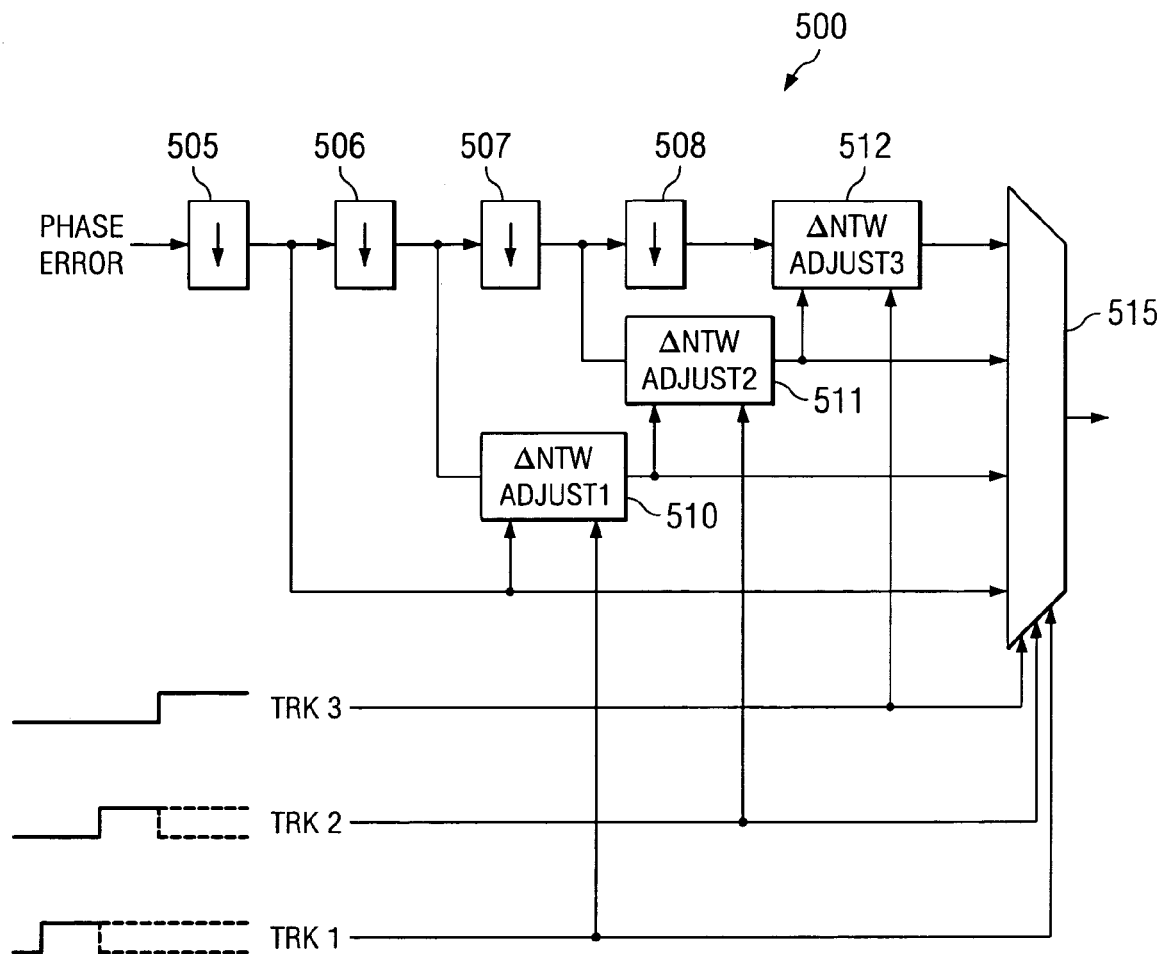
FIG. 5*a* is a diagram of a portion of an ADPLL with the capability of making fine adjustments to the loop gain, according to a preferred embodiment of the present invention.

With reference now to FIG. 5a, there is shown diagram illustrating a portion of an ADPLL 500 with the capability of making fine adjustments to the loop gain, according to a preferred embodiment of the present invention. As in FIGS. 3a and 3b, in FIG. 5a only the portion of the ADPLL 500 related to the adjustment of the loop gain is displayed, with the remaining portions of the ADPLL 500 left out to place emphasis on the loop gain adjustment circuitry. While FIGS. 3a and 3b illustrated ADPLLs with the ability to adjust the loop gain from a first value to a second value, the ADPLL 500 displayed in FIG. 5a can adjust the loop gain from a first value to a second value, then finally to a third value, and finally to a fourth value.

The adjustments to the loop gain, $\alpha$, are made in a gain adjuster (for example, gain adjuster 505). Since the ADPLL 500 is an all digital PLL, the loop gain, $\alpha$, can be stored as a binary value. For arbitrary reductions in the loop gain, the gain adjuster 505 can implement an arithmetic multiplier algorithm to reduce the loop gain by the desired amount. However, if the reduction in the loop gain were limited to powers of two, then the gain adjuster 505 can implement loop gain reductions as an integer number of binary shifts. For example, if a loop gain were to be reduced by a factor of four, then the reduction can be implemented as easily as a two-bit right shift. If the loop gain values are stored so that the leftmost bit is the most significant bit, then the gain adjuster 505 would perform right shifts.

As discussed above, it may be preferred that the adjustments to the loop gain be made in multiple small increments, rather than a single large jump. Therefore, it may be preferred that each gain adjuster halves (or quarters) the loop gain, implemented by a single one-bit shift (or two-bit shift). Thus, as displayed in FIG. 5a, the overall loop gain adjustment can be ½*½*½ of the original loop gain, in other words, the final loop gain is ⅛$^{th}$ the magnitude of the original loop gain. According to a preferred embodiment of the present invention, a practical upper limit on the number of gain adjusters may be approximately sixteen (16). Although there are no physical limits on the number of gain adjusters used in an ADPLL.

In addition to adjusting the loop gain, the ADPLL 500 creates a new normalized tuning word ($\Delta$NTW) that can be used to adjust the DCO. The normalized tuning words can be created in a normalized tuning word unit (for example, normalized tuning word unit 510). For example, the output of the normalized tuning word unit 510 can be $\Delta NTW_1 = \alpha_1\phi_1 - \alpha_2\phi_1$, while the output of a normalized tuning word unit 511 can be $\Delta NTW_2 = (\Delta NTW_1 + \alpha_2\phi_2) - \alpha_3\phi_2$. Details of the design of a normalized tuning word unit will be provided below.

The normalized tuning word unit 510 can be controlled by a tracking signal, "TRK1". According to a preferred embodiment of the present invention, when the tracking signal becomes active, the normalized tuning word unit 510 to which it is coupled turns on. Output from the multiple normalized tuning word units in addition to the output of the gain adjuster 505 may be provided to a multiplexer 515 that can be controlled by the tracking signals, preferably the same tracking signals used to turn on the normalized tuning word units. Depending on the level of the tracking signals, one of the inputs to the multiplexer 515 may be provided to the output of the multiplexer 515 where it can be used to tune the DCO. As discussed previously, once a tracking signal transitions into the active level, tracking signals below it become "don't cares." For example, once tracking signal "TRK3" becomes active, then tracking signals "TRK2" and "TRK1" become "don't cares."

Figure 5B:
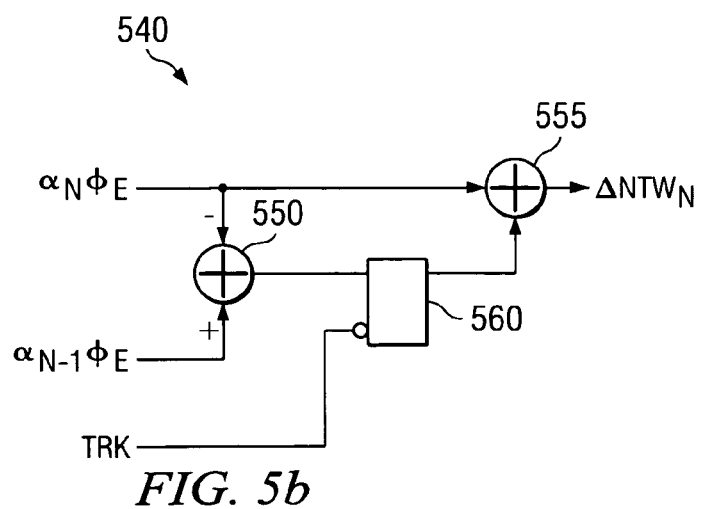
FIG. 5*b* is a diagram of a normalized tuning word unit, according to a preferred embodiment of the present invention.

With reference now to FIG. 5b, there is shown a diagram illustrating a detailed view of a normalized tuning word unit 540, according to a preferred embodiment of the present invention. The normalized tuning word unit 540 can be used in any of the normalized tuning word units 510, 511, or 512 of FIG. 5a. The normalized tuning word unit 540 can be created using two summing points 550 and 555 and a latch 560. The first summing point 550 subtracts $\phi_E{}^*\alpha_N$, where $\phi_E{}^*\alpha_N$ is the output of a corresponding gain adjuster, from $\phi_E{}^*\alpha_{N-1}$ (if the normalized tuning word unit 540 is a first normalized tuning word unit) or the output of a previous normalized tuning word unit (if the normalized tuning word unit 540 is not a first normalized tuning word unit). The result of the subtraction can then be stored in the latch 560 when the latch 560 is enabled (when a signal "TRK" transitions from low to high). The result of the subtraction can then be combined with $\phi_E{}^*\alpha_N$ in the second summing point 555, creating an output of the normalized tuning word unit 540.

Figure 6:
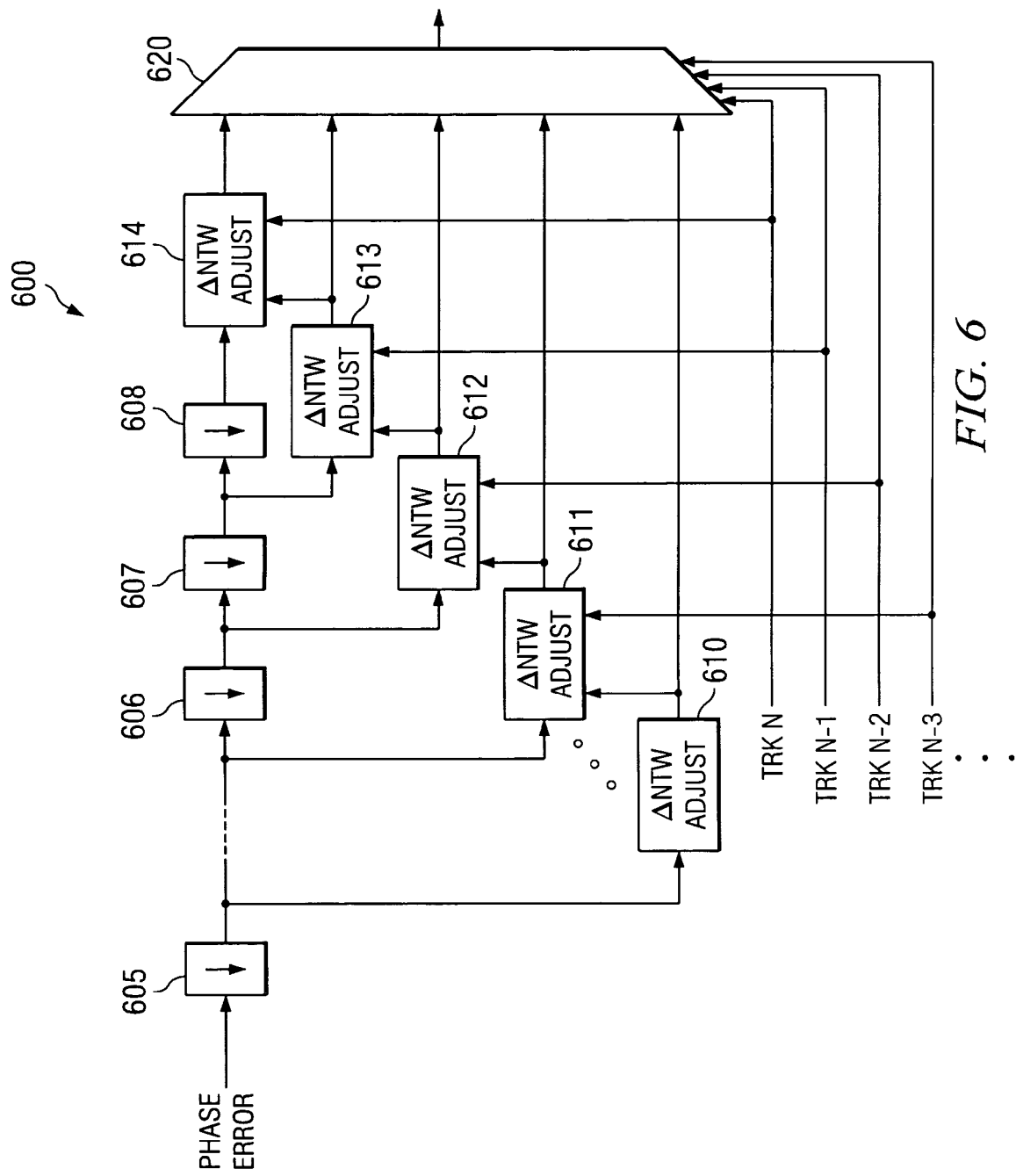
FIG. 6 is a diagram of a portion of an ADPLL capable of making N adjustments to the loop gain, according to a preferred embodiment of the present invention.

With reference now to FIG. 6, there is shown a diagram illustrating a view of a portion of an ADPLL 600 capable of making N adjustments to the loop gain, where N is a positive integer, according to a preferred embodiment of the present invention. FIG. 6 illustrates an extension of the ADPLL 500 (FIG. 5a) wherein the ADPLL 600 features N+1 gain adjusters (illustrated as 605 through 608), N normalized tuning word units (610 through 614) where each normalized tuning word unit is controlled by one of N tracking signals. An (N+1)-to-1 multiplexer 520, controlled by the N tracking signals can be used to select one of the N+1 different values of loop gain.

Figure 7:
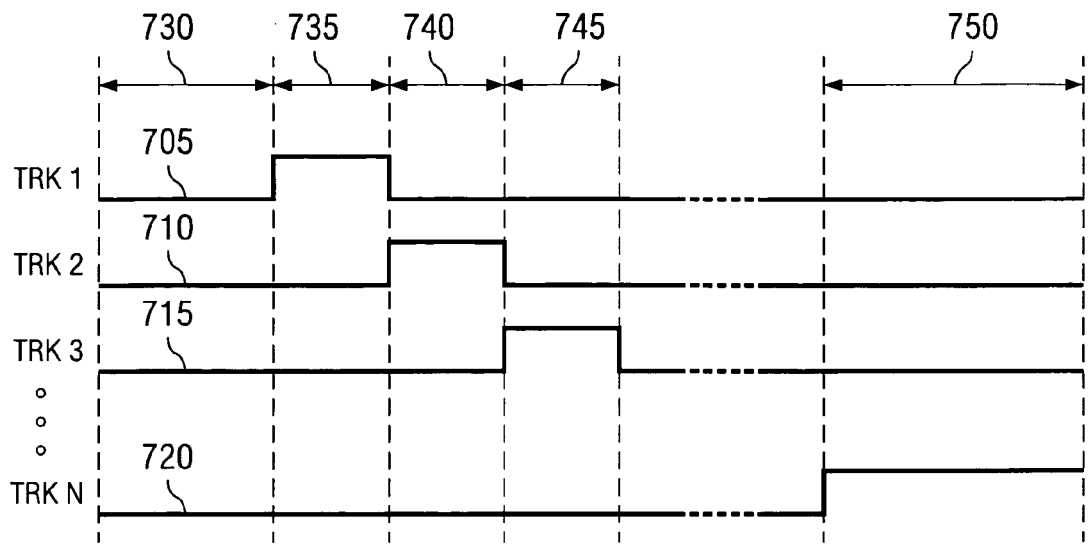
FIG. 7 is a timing diagram showing the operation of a portion of an ADPLL, according to a preferred embodiment of the present invention.

With reference now to FIG. 7, there is shown a timing diagram illustrating a plurality of signal traces representing tracking signals that can be used to control the adjustment of an ADPLL's loop gain, according to a preferred embodiment of the present invention. As discussed earlier, tracking signals (such as "TRK 1", "TRK 2", and so forth), can be used to control the application of loop gain adjustments. For example, depending on the state of the tracking signals, appropriately adjusted tuning words can be provided to the ADPLL's DCO.

A series of timing traces (705 through 720) illustrate an exemplary sequence of possible states assumed by N tracking signals. A first timing trace 705 can illustrate the behavior of tracking signal "TRK 1", a second timing trace 710 can illustrate the behavior of tracking signal "TRK 2", a third timing trace 715 can illustrate the behavior of tracking signal "TRK 3", while a fourth timing trace 720 can illustrate the behavior of tracking signal "TRK N".

During a first interval of time (illustrated as highlight 730), perhaps after an initial reset of the ADPLL followed by an acquisition, all tracking signals are at low levels. Referencing back to FIG. 6, when all tracking signals are in a low state, the ADPLL loop gain may be set at $\alpha_1$. Then, in a second interval of time (illustrated as highlight 735), tracking signal "TRK 1" (the first timing trace 705) transitions into a high state. Again, referencing back to FIG. 6, when tracking signal "TRK 1" is high, then the ADPLL loop gain may have undergone a gain adjustment and may now be equal to $\alpha_2$. Similarly, in a third interval of time (illustrated as highlight 740), tracking signal "TRK 1" may return to a low state while tracking signal "TRK 2" may assume a high state. The resulting ADPLL loop may now be $\alpha 3$. This can continue until tracking signal "TRK N" becomes active (an Nth+1 interval of time 750). Note that while the first, second, third and subsequent intervals of time may be of finite duration, the (N+1)th interval of time 650 may last for as long as the ADPLL operates, until the end of a packet the ADPLL is tracking, until the ADPLL is reset, or the ADPLL no longer wishes to operate at its minimal bandwidth.

Note that while the various tracking signals (such as "TRK 1" and "TRK 2" and so forth) are displayed as transitioning from an inactive level to an active level and then back to an inactive level, it is possible that after a tracking signal makes its initial transition from an inactive level to an active level, it does not matter what happens after the initial transition. For example, with tracking signal "TRK 1", in an interval displayed as highlight 735, it transitions from an inactive level to an active level, then at the end of the interval, the tracking signal "TRK 1" transitions back to an inactive level. However, the tracking signal "TRK 1" may remain in the active level at the end of the interval with no adverse effect on the operation of the present invention.

Note that as displayed in FIG. 7, the second, third, and a fourth intervals of time 735, 740, and 745 are of the same duration. However, it is possible that each interval of time (the times when tracking signals "TRK 1" through "TRK N−1" are in a high state) may be of differing durations or that some of the intervals may be equal in duration and some others may be different. Additionally, the duration of the first interval of time 730 may or may not be equal to the other intervals of time. In general, it is typical to have the durations of time change with the loop gain value. With small values of loop gain, it can be normal to have longer durations of time while with large values of loop gain, it can be normal to have shorter durations of time. This can be a result of the PLL having a large loop bandwidth when the loop gain value is large and a small loop bandwidth when the loop gain value is small.

The operation of the loop gain adjustment in the ADPLL as described in the discussion of FIG. 7 is deterministic, meaning that it is known beforehand that after a certain amount of time (after ADPLL initialization or reset), the ADPLL will be operating in its minimal loop gain setting. However, it may be advantageous to be able to stop making adjustments to the loop gain earlier if the performance of the ADPLL is sufficient.

Figure 8:
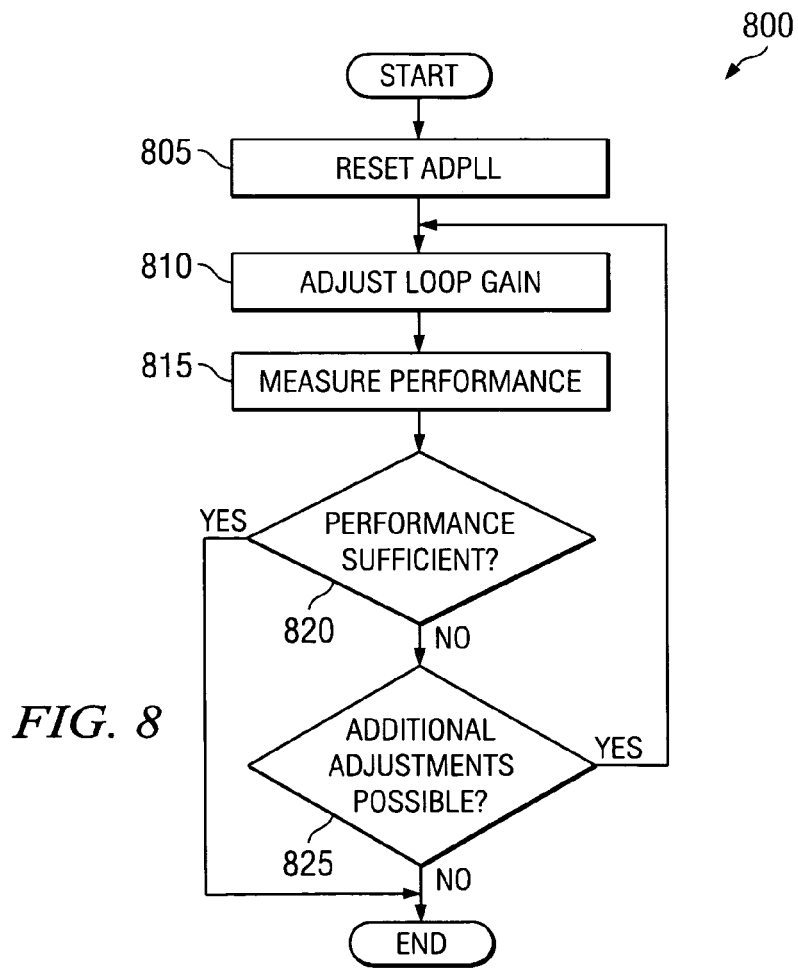
FIG. 8 is flow diagram showing an algorithm that can control the adjustment of the loop gain of an ADPLL, wherein a performance metric can be used to determine a stopping point for the loop gain adjustments, according to a preferred embodiment of the present invention.

With reference now to FIG. 8, there is shown a flow diagram illustrating an algorithm 800 that can be used to control the adjustment of the loop gain of an ADPLL, wherein the algorithm 800 can make use of performance metrics to determine when to stop making adjustments to the loop gain, according to a preferred embodiment of the present invention. According to a preferred embodiment of the present invention, the algorithm 800 may execute in a controller (not shown) for the ADPLL, wherein the controller may be a processing element, a state machine, a digital signal processor, a general purpose micro-processor, a micro-controller, or so forth. Alternatively, the algorithm 800 may be specially implemented in a custom designed integrated circuit that is specifically designed to control the function of the ADPLL.

The controller can begin by resetting the ADPLL (block 805). The ADPLL may be reset at power up or it may be reset after a receiver in which it is located has completed the reception of a transmission or it may be reset after a previously received packet is complete. Resetting the ADPLL may be used to restore registers and other memory storage elements to an initial state and so forth. After resetting the ADPLL, the controller can perform an initial adjustment to the loop gain (block 810). This initial adjustment may occur immediately after the reset to set the loop gain to some initial value.

After setting the loop gain (block 810) and permitting sufficient time for settling to take place, the controller can measure the performance of the ADPLL (block 815). An example of a performance metric may be an ADPLL settling criteria, such as a flatness of the slope of the running average of the phase error. In a digital PLL, the phase error (or tuning word) samples are digital values that can be digitally processed. The digital processing can readily determine the flatness of the slope of the phase error. Therefore, digital processing can be used to measure various qualitative measurements of how settled the ADPLL has become.

After measuring the performance metric, the controller can determine if the performance of the ADPLL has satisfied a predetermined value (block 820). This may be a simple comparison of the measured performance metric against the predetermined value. For example, if the performance metric is a slope of the running average, then a simple comparison with a predetermined value could provide information on how settled the ADPLL has become. Alternatively, digital processing can be used to determine a root-mean-squared (rms) or a mean squared (MS) value of noise or a peak value of noise or a mean of an absolute value of the phase error. Noise may be a good performance metric due to the fact that a value for loop gain can be a tradeoff between various sources of noise. If the loop gain is reduced, then the DCO noise contribution is increased, but the reference and time-to-digital converter noise contributions are decreased.

If the performance of the ADPLL satisfies a predetermined value, then the controller may stop adjusting the loop gain and the algorithm 800 may terminate. If the performance of the ADPLL does not satisfy the predetermined value, then the controller may attempt to further adjust the loop gain. However, the controller may need to determine if further adjustments to the loop gain is possible (block 825). For example, there simply may not be any additional gain adjusters. If the controller can still adjust the loop gain, then the controller may return to block 810 to further adjust the loop gain. If the controller can no longer adjust the loop gain, the controller may have to accept the performance of the ADPLL and the algorithm 800 may terminate.

Note that while the above discussion of the algorithm 800 focuses upon adjusting the loop gain, $\alpha$, through the use of a performance metric, the algorithm 800 can also be used to make adjustments to the attenuation factor, $\lambda$. For example, based on a measured performance metric, additional IIR filters (such as the IIR filters 360-363 (FIG. 3c)) can be enabled to adjust the attenuation factor, $\lambda$. Furthermore, the algorithm 800 can be used to make adjustments on both the loop gain, $\alpha$, and the attenuation factor, $\lambda$.

Figure 9A:
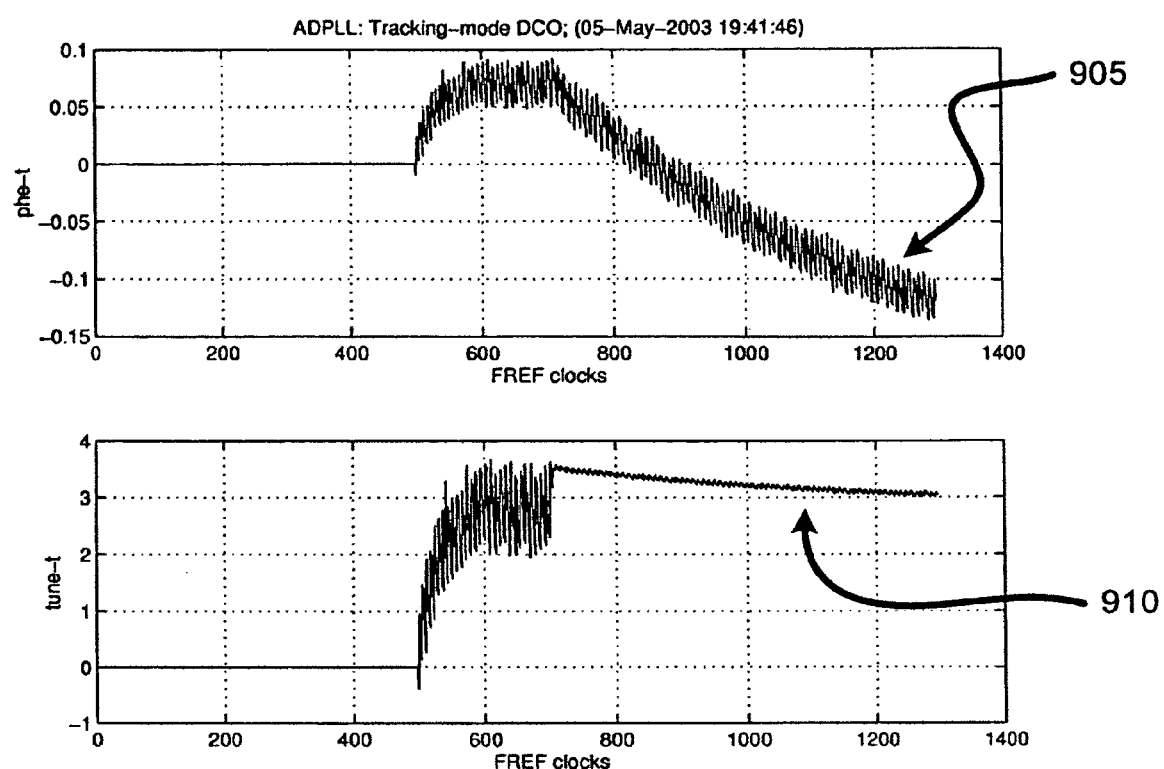
FIGS. 9*a* through 9*c* are data plots showing the performance of a type-I ADPLL with single and double gear shifting, according to a preferred embodiment of the present invention.
Figure 9B:
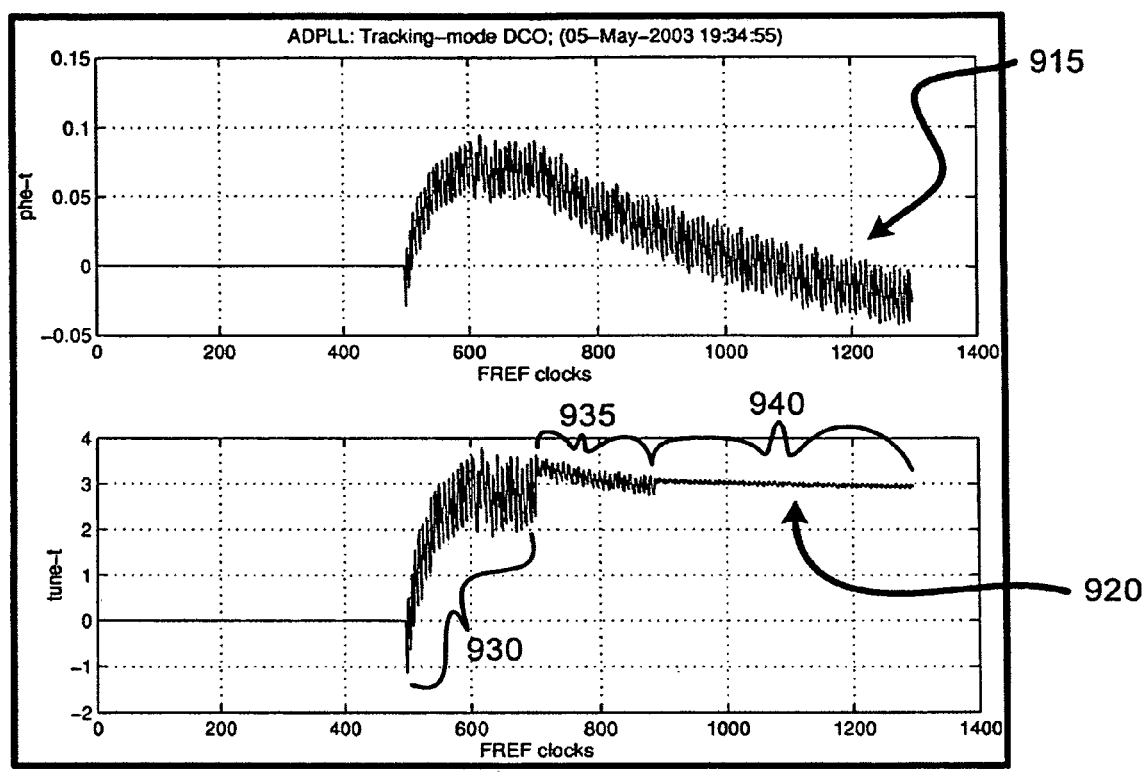

With reference now to FIGS. 9a and 9b, there are shown data plots illustrating the performance differences between single gear shifting (one shift between an initial loop gain value and a final loop gain value) and double gear shifting (two shifts between an initial loop gain value and a final loop gain value), according to a preferred embodiment of the present invention. For example, the single gear shifting involves a shifting of the loop gain value from an initial $\alpha$ of $$\frac{1}{2^{-5}}$$

to a final $\alpha$ of $$\frac{1}{2^{-9}},$$

while with the double gear shifting, the $\alpha$ is shifted to an intermediate value of $$\frac{1}{2^{-7}}$$

prior to being shifted to the final value of $$\frac{1}{2^{-9}}.$$

FIG. 9a illustrates phase error during tracking (phe) vs. clock cycles (top plot) and oscillator tuning words (tune) vs. clock cycles (bottom plot) for a single gear shifting ADPLL. FIG. 9b illustrates the same plots vs. clock cycles for a double gear shifting ADPLL. The phase error vs. clock cycle plots (top plots of both FIGS. 9a and 9b) show that in the single gear shifting case there is a significantly larger transient. This transient must then stabilize in an ADPLL with a relatively small bandwidth.

The bottom plots of FIGS. 9a and 9b illustrate tuning word vs. clock cycles for single gear shifting (FIG. 9a) and double gear shifting (FIG. 9b) for the multiple operating phases of an ADPLL. Once gain, a performance improvement may be seen in the double gear shifting by comparing the first tuning word curve 910 (single gear shifting) and the second tuning word curve 920 (double gear shifting), wherein the slope of the second tuning word curve 920 is relatively flat by approximately 900 clock cycles while the slope of the first tuning word curve 910 still has a pronounced negative value at past 1200 clock cycles. Note also the presence of a transition from a relatively noisy first portion (portion 930) of the second tuning word curve 920 into a second portion (portion 935) with less noise and then finally, to a third portion (portion 940) with relatively little noise. The first tuning word curve 910 displays two such portions (portions not highlighted). This illustrates the shifting of the loop gain values. Note that while the data plots displayed in FIGS. 9a and 9b are for single and double gear shifting ADPLLS, similar behavior may be seen in data plot for triple (and above) gear shifting.

Figure 9C:
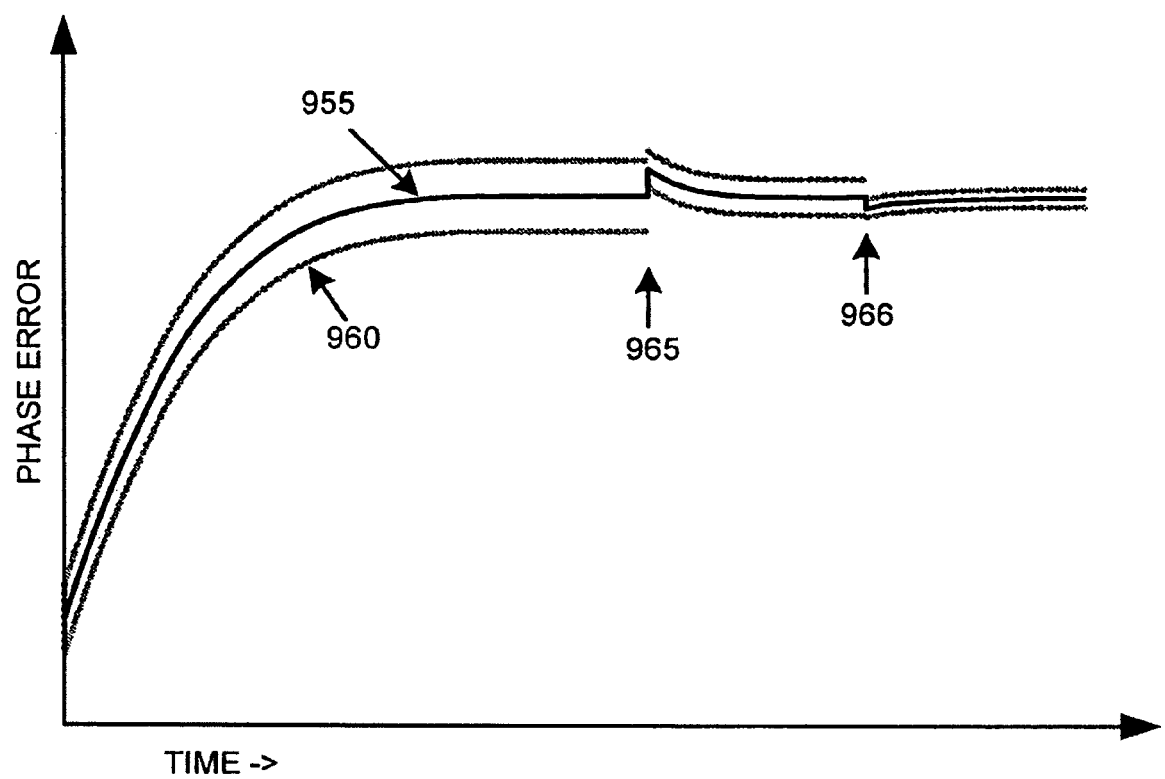

With reference now to FIG. 9c, there is shown a data plot illustrating phase error vs. time for an ADPLL with double gear shifting, according to a preferred embodiment of the present invention. A first curve 955 illustrates the phase error versus time behavior for an ADPLL with double gear shifting. A second curve 960 (surrounding the first curve 955) denotes a maximum and minimum bound of a noise envelope for the first curve 955. A first discontinuity 965 illustrates a transient introduced into the loop by a first changing of the loop gain while a second discontinuity 966 illustrates another transient introduced by a second changing of the loop gain. Note that as the loop gain is reduced, the maximum and minimum bound on the first curve 955 is also reduced.

An extension to the gear-shifting can be made by introducing an IIR filter into the loop. In addition to changing loop bandwidth by changing the loop gain value, it is also possible to reduce the loop bandwidth by changing the location of a pole of an IIR filter. By using the attenuating factor, λ, it is possible to move the location of the pole of the IIR filter and hence reduce the loop's bandwidth.

Figure 10:
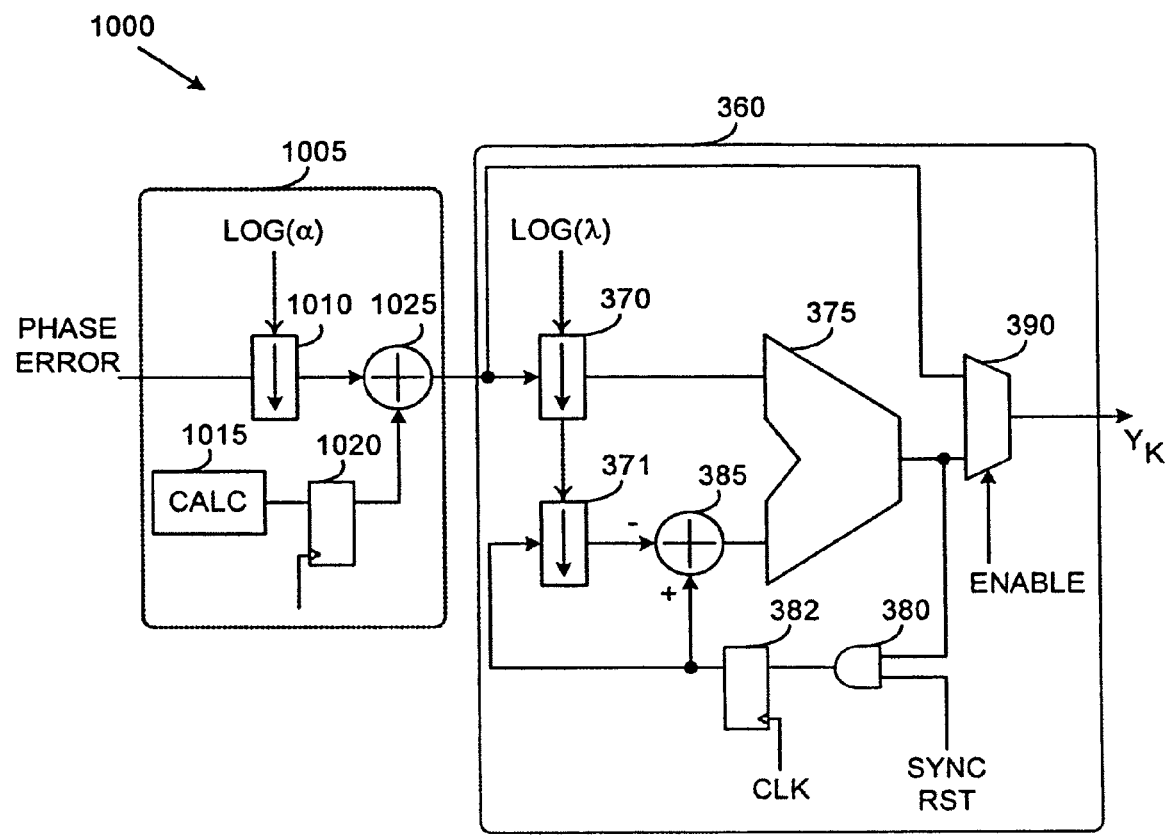
FIG. 10 is a diagram of a switchable proportional loop gain and/or IIR filter for use in an ADPLL, according to a preferred embodiment of the present invention.

With reference now to FIG. 10, there is shown a diagram illustrating a portion of an ADPLL with a switchable proportional loop gain 1005 and/or IIR filter 360, according to a preferred embodiment of the present invention. The switchable proportional loop gain 1005 is essentially similar to one displayed in FIG. 4a with the exception that a calculate unit 1015 now encompasses the computation needed to generate the normalized tuning word. The switchable proportional loop gain 1005, as illustrated in FIG. 10 can adjust the loop gain by a factor of a. The IIR filter 360 is as described in FIG. 3d.

Note that it can be possible to switch the bandwidth of the IIR filter 360 (hence, adjust the loop bandwidth by moving the location of the pole of the IIR filter) without incurring the baseline hit of the output. Hence no additional adjustment is needed, as is required when making adjustments to the loop bandwidth by changing the proportional loop gain. Additionally, since the IIR filter 360 is always performing the filtering (regardless of the value of the enable signal), enabling the IIR filtering has little or no effect on the loop.

According to a preferred embodiment of the present invention, the switchable proportional loop gain 1005 and/or IIR filter 360 can operate as a simple proportional loop gain by not enabling the IIR filter 360 (via the enable line to the multiplexer 390). Alternatively, the switchable proportional loop gain 1005 and/or IIR filter 360 can operate with both the proportional loop gain and the IIR filter affecting the loop bandwidth. Finally, in certain circumstances, it can be possible to disable the proportional loop gain portion of the switchable proportional loop gain 1005 and/or IIR filter 360 and use only the IIR filter 360 to affect the loop bandwidth. According to another preferred embodiment of the present invention, it can be possible to cascade several of the switchable proportional loop gain 1005 and/or IIR filter 360 blocks as illustrated in FIG. 10 together in a manner that is similar to the fine-grained gear-shifting discussed above. By cascading several of these blocks together, it is possible to make multiple small changes to the loop gain, rather than a single large change.

Type-II and higher order PLLs offer an advantage over type-I PLLs in that they offer a higher degree of noise filtering (−40 dB/decade for type-II as opposed to −20 dB/decade for type-I). Additionally, type-II PLLs provide attenuation of $1/\omega^2$ as compared to type-I PLLs (20 dB/decade attenuation for type-II as opposed to a simple flattening for type-I) under special conditions. Therefore, type-II and higher order PLLs may be preferred in situations over type-I PLLs where noise is critical.

Unfortunately, type-II and higher order PLLs have larger transients and therefore the acquisition may take longer. However, in the case of an ADPLL, it may be possible to delay the type-II behavior of the ADPLL until the ADPLL has entered a signal tracking phase, where the type-II noise filtering and attenuation properties can improve performance. During a signal acquisition phase, the ADPLL may be operating with type-I behavior which can offer greater overall bandwidth and hence better signal acquisition.

Figure 11:
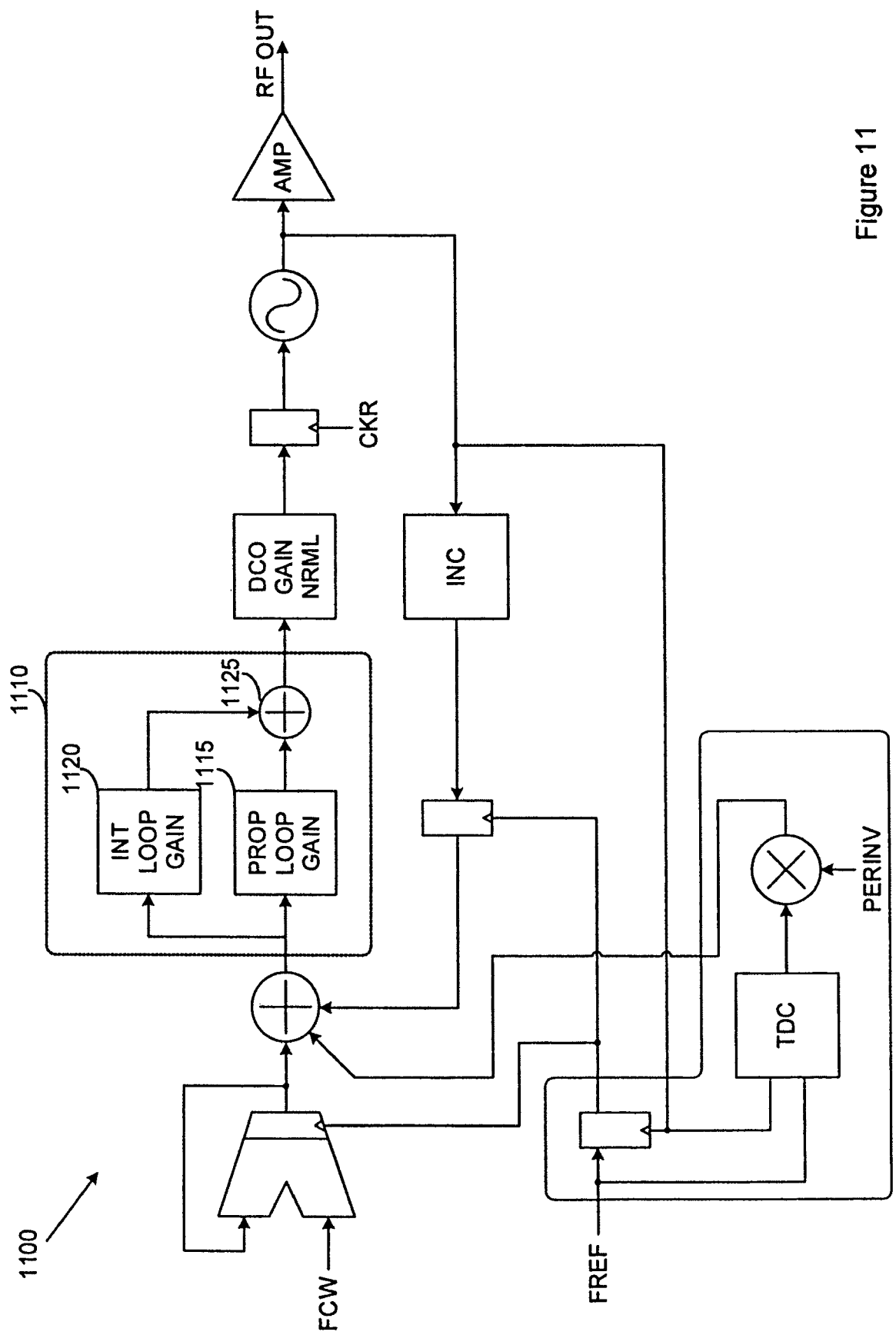
FIG. 11 is a diagram of a type-II ADPLL with a possible type-I ADPLL initial signal acquisition mode, according to a preferred embodiment of the present invention.

With reference now to FIG. 11, there is shown a diagram illustrating an ADPLL 1100 with built-in support for switching from type-I operation in signal acquisition mode to type-II operation in signal tracking mode, according to a preferred embodiment of the present invention. The ADPLL 1100 as displayed in FIG. 11 is similar to the ADPLL 100 (FIG. 1) with exception of a loop filter block 1110 (called the loop gain block 125 in FIG. 1). Due to its similarity with the ADPLL 100, the remaining portions of the ADPLL 1100 will not be discussed herein.

The loop filter block 1110 of the ADPLL 1100 may include a proportional loop gain block 1115 and an integral loop gain block 1120 that share a common input and may be combined together via a summing point 1125. The proportional loop gain block 1115 may have a gain of a and may be similar to the loop gain block 125 (FIG. 1). Note that although the proportional loop gain block may be displayed as a single gain adjust unit, the proportional loop gain block may be implemented as a fine-grained gear shifting unit using a plurality of gain adjust units, such as those described above. The integral loop gain block 1120 may be used to add an additional pole at zero frequency, thus giving rise to a type-II ADPLL. In the phase domain, the behavior of the integral loop gain block 1120 may be expressed as $$\frac{\rho^* z^{-1}}{1-z^{-1}},$$

where $z^{-1}$ is a delay element.

According to a preferred embodiment of the present invention, it is preferred that the integral loop gain block 1120 be inactive until the ADPLL 1100 enters frequency/phase tracking mode. This implies that during signal acquisition mode, only the proportional loop gain block 1115 be active. Therefore, when the ADPLL 1100 requires the greatest loop bandwidth, the ADPLL 1100 is operating like a type-I ADPLL. After frequency/phase acquisition mode completes, the proportional loop gain may be attenuated (such as above via gear shifting) and at some possible later time, the integral loop gain block 1120 may be activated and the summing point 1125 combines the output of the two gain blocks together.

As described previously, during signal acquisition mode, a DC offset may be present in the phase error or the DCO tuning word. In a type-I ADPLL, phase error is proportional to the frequency offset. However, in a type-II ADPLL, the DC offset may be considered an undesirable phase error bias, which may take a long time to settle in the ADPLL 1100. A solution would be to subtract this DC offset from the phase error.

Figure 12:
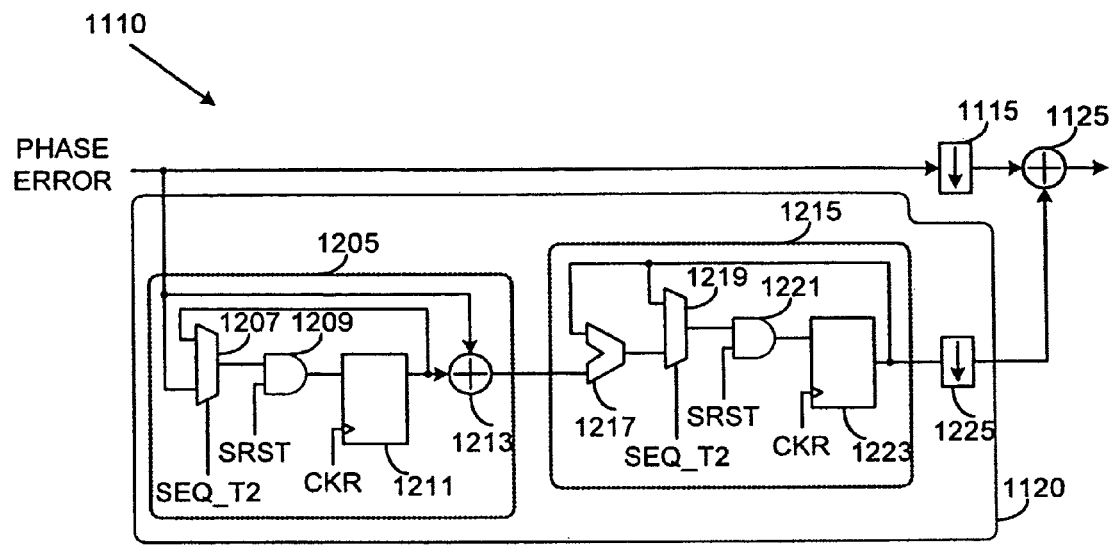
FIG. 12 is a diagram of a type-II loop filter for a type-II ADPLL, according to a preferred embodiment of the present invention.

With reference now to FIG. 12, there is shown a block diagram illustrating a type-II loop filter block for an ADPLL, according to a preferred embodiment of the present invention. According to a preferred embodiment of the present invention, the type-II loop filter block displayed in FIG. 12 may be a possible implementation for the type-II loop filter block 1110 displayed in FIG. 11. The type-II loop filter block 1110 features two signal flow paths. A first signal flow path may be used to implement a proportional loop gain block (such as the proportional loop gain block 1115 (FIG. 11)) while a second signal flow path may be used to implement an integral loop gain block (such as the integral loop gain block 1120 (FIG. 11)). According to a preferred embodiment of the present invention, the proportional loop gain block 1115 may be implemented with a binary shifter, such as described previously. Finally, a summing point (such as the summing point 1125 (FIG. 11)) may be used to combine the outputs of the proportional and integral loop gain blocks.

The integral loop gain block 1120 may include a residue latch 1205 that may be used to provide compensation for the DC offset by sampling a phase error at the initial interval of type-II loop operation and can output an adjusted phase error (current phase error—sampled phased error). The adjusted phase error may then be accumulated in an integral accumulator 1215. According to a preferred embodiment of the present invention, the residue latch 1205 may include a multiplexer 1207 which can be controlled by a sequence control signal "SEQ_T2" and the phase error as one input and a sampled phase error as another input. Output of the multiplexer 1207 may be an input to an AND gate 1209. The AND gate 1209 can be used to clear the sampled phase error that may be stored in a flip-flop 1211. The clearing of the flip-flop 1211 may be accomplished through a synchronous reset signal "SRST". Finally, a summing point 1213 may be used to combine the sampled phase error with the current phase error to produce the adjusted phase error discussed above.

The integral accumulator 1215 may include an arithmetic unit (adder) 1217 that may have the output of the residue latch 1205 as an input and samples of the integral accumulator as another input. The output of the arithmetic unit 1217 may then be selectively coupled to an AND gate 1221 by a multiplexer 1219. The multiplexer 1219 may be controlled by a sequence control signal "SEQ_T2", the same signal that may be used to control the multiplexer 1207 in the residue latch 1205. The multiplexer 1219 can selectively couple either the output of the adder 1217 or the samples of the integral accumulator to the AND gate 1221. The AND gate 1221 may be used to synchronously reset the contents of a flip-flop 1223 through the use of the "SRST" signal. Finally, the output of the integral accumulator 1215 may be gain adjusted by a gain adjuster 1225, which controls integral term. According to a preferred embodiment of the present invention, the gain adjuster 1225 can make powers of 2 adjustments to the output of the integral accumulator 1215 by performing binary shifts.

Figure 13:
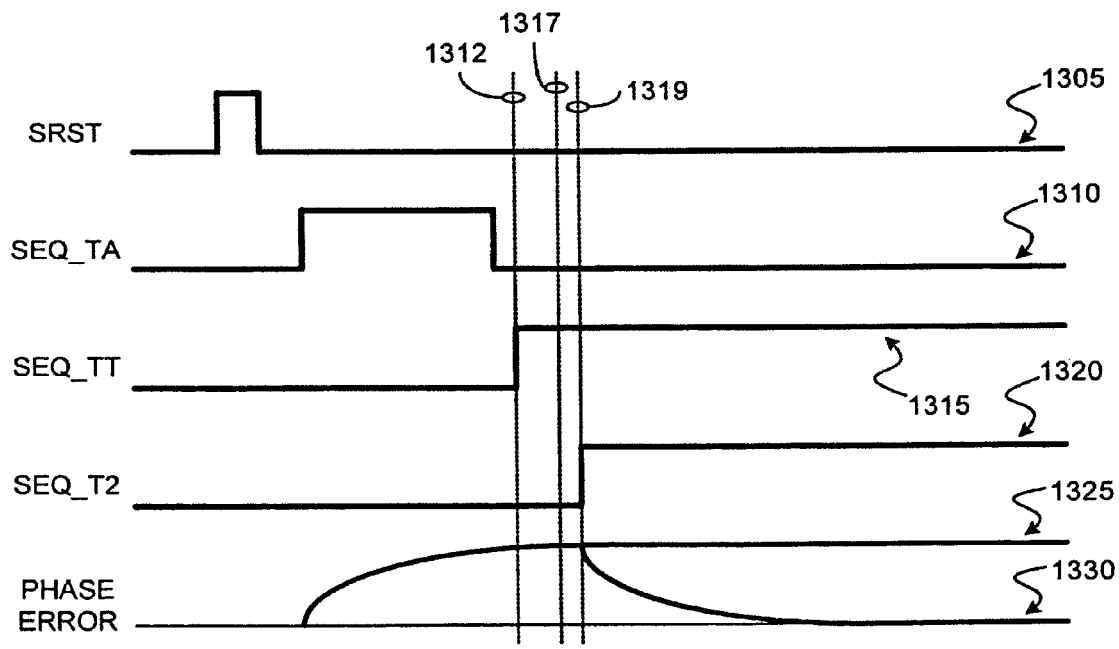
FIG. 13 is a timing diagram illustrating the operation of a type-II ADPLL, according to a preferred embodiment of the present invention.

With reference now to FIG. 13, there is shown a timing diagram illustrating the operation of a type-II ADPLL, according to a preferred embodiment of the present invention. According to a preferred embodiment of the present invention, the timing diagram illustrated in FIG. 13 may be representative of signal values that can be used to control the operation of a type-II ADPLL such as one illustrated in FIG. 11. A first curve 1305 illustrates a synchronous reset signal line "SRST" that can be used to reset the type-II ADPLL. In FIG. 102, a signal "SRST" can be used to synchronously reset the contents of the flip-flops 1211 and 1223. A second curve 1310 illustrates a sequence control signal line "SEQ_TA" that can be used to turn a fast tracking mode (using acquisition mode gain factor, α) on and off for the type-II ADPLL. As discussed previously, the signal acquisition mode of the type-II ADPLL may involve the ADPLL actually operating as a type-I ADPLL with a relatively large loop bandwidth to permit rapid acquisition of a signal.

A third curve 1315 illustrates a sequence control signal line "SEQ_TT" that can be used to turn a signal true tracking mode on and off for the type-II ADPLL. The signal tracking mode has a smaller loop bandwidth so that the ADPLL may have lower overall noise. Note that the "SEQ_TA" and "SEQ_TT" signal lines should not be active simultaneously. Therefore, a small amount of time after the signal line "SEQ_TA" becomes inactive, the signal line "SEQ_TT" becomes active and turns on the signal tracking mode of the ADPLL. A first dashed vertical line 1312 represents the time when the signal line "SEQ_TT" becomes active. A small amount of time after the signal line "SEQ_TT" becomes active, the DC offset present in the phase error is sampled. The instance of time is shown as a second dashed vertical line 1317. According to a preferred embodiment of the present invention, the DC offset is sampled by a residue latch (such as the residue latch 1205 (FIG. 12)).

A fourth curve 1320 illustrates a sequence control signal line "SEQ_T2" that can be used to turn the ADPLL into a type-II loop. This can be accomplished by turning on a residue latch (such as the residue latch 1205 (FIG. 12)) and an integral accumulator (such as the integral accumulator 1215 (FIG. 12)). A fifth trace illustrates the effect of the DC offset on the phase error with curve 1325 illustrating the phase error with residue and curve 1330 illustrating the phase error without residue.

Figure 14:
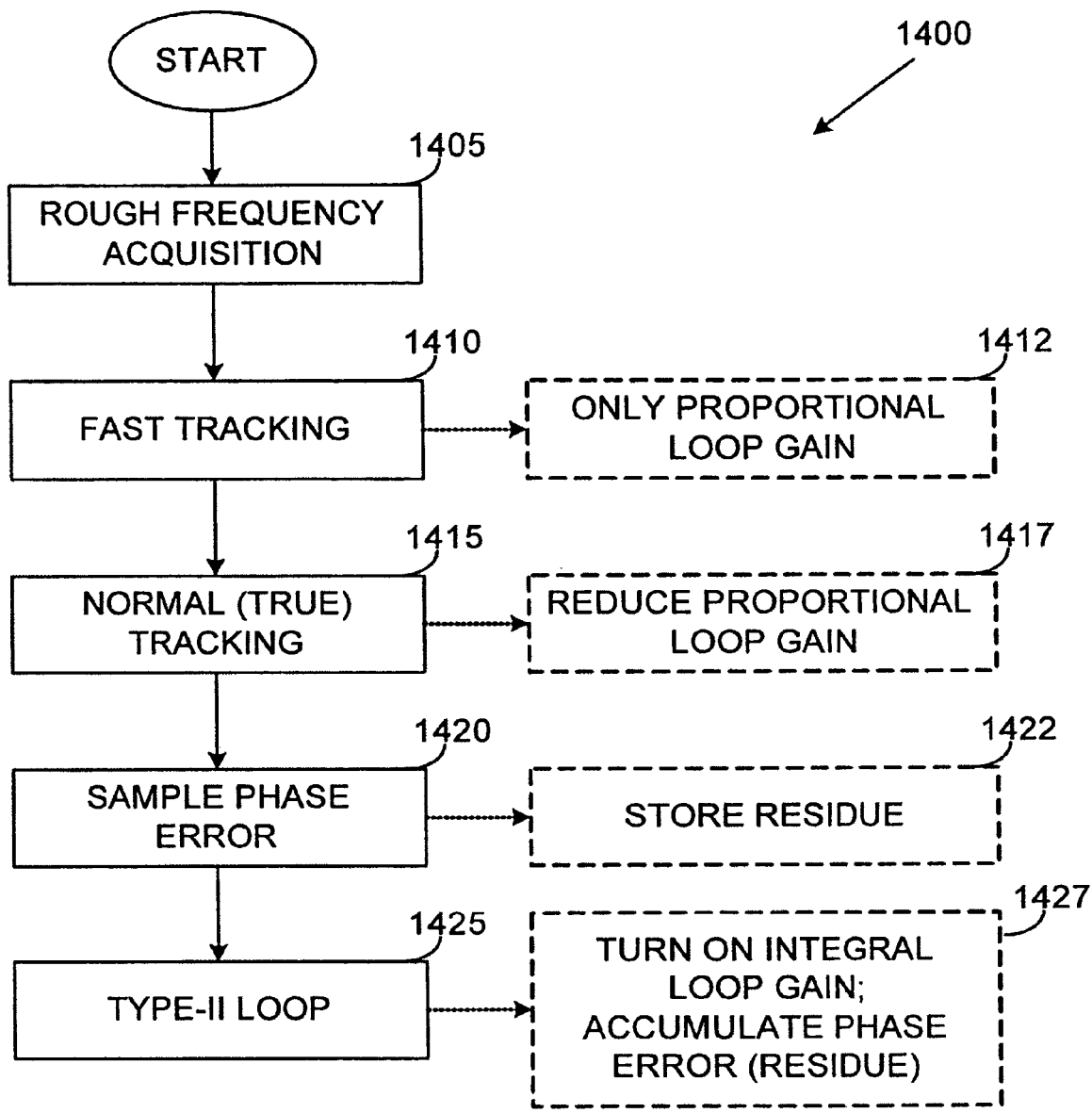
FIG. 14 is a flow diagram illustrating the operation of a type-II ADPLL, according to a preferred embodiment of the present invention.

With reference now to FIG. 14, there is shown a flow diagram 1400 illustrating the operation of a type-II ADPLL with phase error residue, according to a preferred embodiment of the present invention. The flow diagram 1400 presents an alternate view of the operation of the ADPLL as it changes through its various modes of operation. A first block 1405 of the flow diagram 1400 illustrates a first operating mode of the ADPLL, wherein it is in a rough frequency acquisition mode. In the rough frequency acquisition mode, the ADPLL roughly (or coarsely) locks onto an initial frequency using PVT-calibration (process, voltage, and temperature) mode. According to a preferred embodiment of the present invention, the ADPLL performs a rough frequency acquisition after it has been powered on or reset.

After rough frequency acquisition, the ADPLL enters a fast tracking mode (as controlled by a sequence control signal "SEQ_TA") (block 1410). In fast tracking mode, the loop gain a can be relatively large and hence, the ADPLL has a large loop bandwidth. The large loop bandwidth permits the ADPLL to quickly acquire the signal that it is tracking. While in fast tracking mode, the ADPLL may make use of only the proportional loop gain portion 1120 (FIG. 11) of its loop filter block (such as loop filter block 1110 (FIG. 11)). After the fast tracking mode (block 1410) completes, the ADPLL may enter what is referred to as normal tracking (or true tracking) mode (block 1415. In normal tracking mode, the proportional loop gain may be reduced to reduce the overall loop bandwidth. By reducing the loop bandwidth, the overall noise in the ADPLL can be reduced.

After the ADPLL enters normal tracking mode, a sample of the phase error may be taken by a residue latch (such as the residue latch 1205 (FIG. 12)) (block 1420). Finally, the ADPLL may enter a type-II mode of operation (block 1425) by enabling its integral accumulator block (such as the integral accumulator 1215 (FIG. 12)). The ADPLL may make use of the sampled phase error (taken in block 1420) to provide compensation of a DC offset present in the phase error. Note that it is possible for the ADPLL to ignore the presence of the DC offset by simply setting the sampled phase error to zero. The ADPLL may then continue in type-II operation mode until it is completed its task or it is reset.

Figure 15:
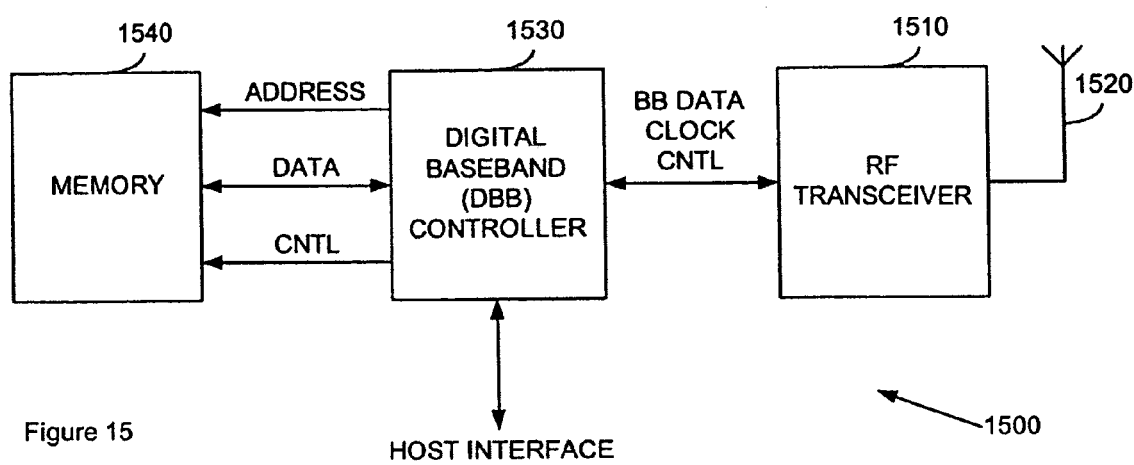
FIG. 15 is a diagram of a wireless communications device containing an ADPLL, according to a preferred embodiment of the present invention.

With reference now to FIG. 15, there is shown a diagram illustrating a wireless communications device 1500 containing an all-digital phase-locked loop (ADPLL), according to a preferred embodiment of the present invention. The ADPLL may be contained in an RF transceiver 1510 that is coupled to an antenna 1520. The ADPLL can be used as a local oscillator for both a transmitter and a receiver located in the wireless communications device 1500. The antenna 1520 is responsible for receiving analog RF signals transmitted over-the-air. Additionally, the antenna 1520 may be used to transmit analog RF signals originating from the wireless device 1500. The RF transceiver 1510 is responsible for taking the analog RF signals received by the antenna 1520 and converting it into a digital data stream that is usable by the remainder of the wireless device 1500. A reverse path can also exist in the wireless communications device 1500, wherein a digital data stream is converted into an analog RF signal that can be transmitted by the antenna 1520, when the wireless communications device operates as a transmitter.

After the RF transceiver 1510 receives and then converts the analog RF signal into a digital data stream, the digital data stream is transferred to a digital baseband (DBB) controller 1530. The DBB controller 1530 is responsible for taking the digital data stream and performs any necessary digital signal processing on it to convert the digital data stream in to a stream of user usable data. Examples of the processing performed by the DBB controller 1530 may include, but is not limited to: digital filtering, data encoding and decoding, error detection and correction, and communications protocol software stacks and applications. The DBB controller 1530 is coupled to a memory 1540 that may contain a read-only memory (ROM), a random access memory (RAM), flash programmable memory, etc. The memory 1540 can be used to store necessary subroutines used in the DBB controller 1530, configuration data, scratch memory, etc.

The DBB controller 1530 may be coupled to some other digital device via a host interface. The host interface may be a proprietary interface or it may be adherent to an interconnection standard such as: RS-232, universal serial bus, Firewire, IEEE 802.11, PC card, etc. The host interface allows the connection of a digital device to the wireless device 1500 via the DBB controller 1530. Examples of digital devices include computers, personal digital assistants, multi-media devices, Internet appliances, storage devices, etc.

Although the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A wireless communications device comprising:
   a radio frequency (RF) port;
   an RF transceiver coupled to the RF port, the RF transceiver containing circuitry to process RF signals and a digital phase-locked loop (PLL) synthesizer coupled to the RF port, the PLL synthesizer comprising:
   a phase detector for providing a phase error signal;
   an oscillator having an tuning input;
   a loop filter circuit coupled to the phase detector, the loop filter circuit containing circuitry to provide filtering of the phase error signal, wherein the loop filter circuit may operate in a fast acquisition mode and subsequently switch into a type-II mode of operation; and
   the wireless communications device further comprising a signal processing unit coupled to the RF transceiver, the signal processing unit containing circuitry to process signal streams and user usable data.

2. The wireless communications device of claim 1, wherein the wireless communications device is used in a wireless communications network.

3. The wireless communications device of claim 2, wherein the wireless communications network is a Bluetooth compliant network.

4. The wireless communications device of claim 2, wherein the wireless communications network is a cellular based communications network.

5. The wireless communications device of claim 1, further comprising a proportional loop gain circuit coupled to the phase detector, the proportional loop gain circuit containing circuitry to scale the phase error signal by a first constant.

6. The wireless communications device of claim 1, further comprising an integral loop gain block coupled to the phase detector, the integral loop gain block containing circuitry to scale the phase error signal by a second constant.

7. The wireless communications device of claim 1, further comprising:
   a proportional loop gain circuit coupled to the phase detector, the proportional loop gain circuit containing circuitry to scale the phase error signal by a first constant; and
   an integral loop gain block coupled to the phase detector, the integral loop gain block containing circuitry to scale the phase error signal by a second constant.

8. The wireless communication device of claim 1, wherein the PLL synthesizer is an all digital PLL, and wherein the oscillator is a digitally controlled oscillator.

9. A wireless communications device comprising:
   a radio frequency (RF) port:
   an RF transceiver coupled to the RF port, the RF transceiver containing circuitry to process RF signals and a digital phase-locked loop (PLL) synthesizer coupled to the RF port, the PLL synthesizer comprising:
   a phase detector for providing a phase error signal;
   an oscillator having an tuning input;
   a loop filter circuit coupled to the phase detector, the loop filter circuit containing circuitry to provide filtering of the phase error signal, wherein the loop filter circuit may operate in a fast acquisition mode and subsequently switch into a type-II mode of operation;
   a signal processing unit coupled to the RF transceiver, the signal processing Unit containing to process signal streams and user usable data; and
   an intergral loop gain block coupled to the phase detector, the intergral loop gain block containing circuitry to scale the phase error signal by a second constant and circuitry to samples the phase error signal.

10. A wireless communications device comprising:
    a radio frequency (RF) port;
    an RF transceiver coupled to the RF port, the RF transceiver containing circuitry to process RF signals and a digital phase-locked loop (ELL) synthesizer coupled to the RF port, the PLL synthesizer comprising:
    a phase detector for providing a phase error signal;
    an oscillator having an tuning input;
    a loop filter circuit coupled to the phase detector, the loop filter circuit containing circuitry to provide filtering of the phase error signal, wherein the loop filter circuit may operate in a fast acquisition mode and subsequently switch into a type-II mode of operation;
    a signal processing unit coupled to the RF transceiver, the signal processing unit containing circuitry to process signal streams and user usable data; and
    a gain normalization circuit coupled to the loop filter circuit, the gain normalization circuit containing circuitry to normalize a tuning signal with respect to a Reference frequency.

11. A wireless communications device comprising:
    a radio frequency (RF) port:
    an RF transceiver coupled to the RF port, the RF transceiver containing circuitry to process RF signals and an all digital phase-locked loop (PLL) synthesizer coupled to the RF port, the PLL synthesizer comprising:
    a phase detector for providing a phase error signal;

an oscillator having an tuning input;
a loop filter circuit coupled to the phase detector, the loop filter circuit containing circuitry to provide filtering of the phase error signal, wherein the loop filter circuit may operate in a fast acquisition mode and subsequently switch into a type-II mode of operation;
a signal processing unit coupled to the RF transceiver, the signal processing unit containing circuitry to process signal streams and user usable data;
a proportional loop gain circuit coupled to the phase detector, the proportional loon gain circuit containing circuitry to scale the phase error signal by a first constant; and
an integral loop gain block coupled to the phase detector, the integral loop gain block containing circuitry to scale the phase error signal by a second constant and wherein the first and second constants are powers of two.

12. A wireless communications device comprising:
a radio frequency (RF) port:
an RF transceiver coupled to the RF port, the RF transceiver containing circuitry to process RF signals and a digital phase-locked loop (PLL) synthesizer coupled to the RF port. the PLL synthesizer comprising:
a phase detector for providing a phase error signal;
an oscillator having an tuning input, wherein the output of a gain normalization circuit provides a tuning signal that is used to adjust an output frequency of the oscillator;
a loop filter circuit coupled to the phase detector, the loop filter circuit containing circuitry to provide filtering of the phase error signal, wherein the loop filte2r circuit may operate in a fast acquisition mode and subsequently switch into a type-II mode of operation; and
a signal processing unit coupled to the RF transceiver, the signal processing unit containing circuitry to process signal streams and user usable data.

13. A wireless communications device comprising:
a radio frequency (RF) port;
at least one of an RF receiver and transmitter, coupled to the RF port, containing circuitry to process RF signals and a loop filter coupled to the RF port, the loop filter comprising:
a proportional loop gain circuit coupled to a phase error input, the proportional loop gain circuit containing circuitry to scale a phase error signal by a first constant;
an integral loop gain block coupled to the phase error input, the integral loop gain block comprising:
a residue latch coupled to the phase error input, the residue latch containing circuitry to sample an offset present in the phase error signal and to produce an adjusted phase error signal;
an integral accumulator coupled to the residue latch, the integral accumulator containing circuitry to accumulate the adjusted phase error signal produced by the residue latch;
a loop gain adjuster coupled to the integral accumulator, the loop gain adjuster containing circuitry to scale the accumulated adjusted phase error signal by a second constant; and
the loop filter circuit further comprising a summing point coupled to the proportional loop gain circuit and the integral loop gain block, the summing point to combine signals from the proportional loop gain circuit and the integral loop gain block.

14. The wireless communication device of claim 13, wherein the phase error signal is represented digitally, and wherein the proportional loop gain circuit comprises a loop gain adjuster containing circuitry to shift the phase error signal by an amount specified by the first constant.

15. The wireless communication device of claim 14, wherein the first constant is a power of two, and wherein the shift is a whole number of bits.

16. The wireless communication device of claim 13, wherein the residue latch comprises:
a latch coupled to the phase error input, the latch to sample the phase error input to measure the offset;
a multiplexer having a first input coupled to the phase error input and a second input coupled to the latch, the multiplexer to selectively couple its inputs to an input of the latch; and
a summing point coupled to the latch and the phase error input, the summing point to calculate the adjusted phase error signal.

17. The wireless communication device of claim 13, wherein one of said RF receiver and one of said transmitter together form a transceiver.

18. The wireless communication device of claim 13, wherein the integral accumulator comprises:
an adder coupled to the residue latch, the adder containing circuitry to accumulate the adjusted phase error signal provided by the residue latch; and
a latch coupled to the residue latch, the latch to sample the accumulated adjusted phase error signal provided by the arithmetic unit.

19. The wireless communication device of claim 13, wherein the integral accumulator has a phase domain transfer function of $$\frac{\rho^* z^{-1}}{1 - z^{-1}},$$

wherein ρ is the second constant.

20. The wireless communication device of claim 13, wherein the accumulated phase error signal is represented digitally, and wherein the loop gain contains circuitry to shift the accumulated phase error signal by an amount specified by the second constant.

21. The wireless communication device of claim 20, wherein the second constant is a power of two, and wherein the shift is a whole number of bits.

22. The wireless communication device of claim 13, wherein the first constant is larger than the second constant.

23. A wireless communications device comprising:
a radio frequency (RF) port;
at least one of an RF receiver and transmitter, coupled to the RF port, containing circuitry to process RF signals and a digital phase-locked loop (PLL) synthesizer coupled to the RF port, the PLL synthesizer comprising:
circuitry for acquiring a signal using a proportional loop gain circuit;
measuring an offset in the signal;
circuitry for activating an integral accumulator to accumulate an adjusted signal, the adjusted signal being the signal combined with the offset; and circuitry for combining outputs from the proportional loop gain circuit and the integral accumulator to produce an oscillator tuning signal.

* * * * *